(12) United States Patent
Hobbs et al.

(10) Patent No.: US 7,622,935 B2
(45) Date of Patent: Nov. 24, 2009

(54) PROBE CARD ASSEMBLY WITH A MECHANICALLY DECOUPLED WIRING SUBSTRATE

(75) Inventors: Eric D. Hobbs, Livermore, CA (US); Alexander H. Slocum, Bow, NH (US); Benjamin N. Eldridge, Danville, CA (US); Keith J. Breinlinger, San Ramon, CA (US); Shawn Powell, Pleasant Hill, CA (US)

(73) Assignee: FormFactor, Inc., Livermore, CA (US)

( * ) Notice: Subject to any disclaimer, the term of this patent is extended or adjusted under 35 U.S.C. 154(b) by 216 days.

(21) Appl. No.: 11/551,545

(22) Filed: Oct. 20, 2006

(65) Prior Publication Data

US 2007/0126440 A1    Jun. 7, 2007

Related U.S. Application Data

(63) Continuation-in-part of application No. 11/164,737, filed on Dec. 2, 2005.

(51) Int. Cl.
*G01R 31/02* (2006.01)
*G01R 31/28* (2006.01)

(52) U.S. Cl. .................................................... 324/754

(58) Field of Classification Search ......... 324/750–758, 324/158.1, 760–762; 439/66, 81, 482, 824; 337/16, 66
See application file for complete search history.

(56) References Cited

U.S. PATENT DOCUMENTS 6,509,751 B1    1/2003  Mathieu et al.

| 6,784,678 | B2 | 8/2004 | Pietzschmann |
| 7,084,651 | B2 * | 8/2006 | Audette et al. ............... 324/754 |
| 7,088,117 | B2 * | 8/2006 | Uher et al. ................... 324/754 |
| 7,112,983 | B2 | 9/2006 | McGinnis |
| 7,119,564 | B2 * | 10/2006 | Martens et al. .............. 324/754 |
| 7,285,968 | B2 * | 10/2007 | Eldridge et al. ............. 324/754 |
| 7,349,223 | B2 * | 3/2008 | Haemer et al. .............. 361/767 |
| 2004/0266089 | A1 | 12/2004 | Mathieu et al. |
| 2007/0126435 | A1 | 6/2007 | Eldridge et al. |

OTHER PUBLICATIONS

International Search Report PCT/US 07/81706 (Sep. 5, 2008).
U.S. Appl. No. 09/527,931, filed Mar. 17, 2007, Mathieu et al.
International Preliminary Report On Patentability PCT/US 07/081706 (Apr. 30, 2009).

* cited by examiner

*Primary Examiner*—Jermele M Hollington
*Assistant Examiner*—Trung Q Nguyen
(74) *Attorney, Agent, or Firm*—N. Kenneth Burraston

(57) ABSTRACT

A probe card assembly can comprise a probe head assembly and a wiring substrate. The probe head assembly can comprise a plurality of probes disposed to contact an electronic device disposed on a holder in a test housing. The wiring substrate can include an electrical interface to a test controller and a plurality of electrical wiring composing electrical paths between the electrical interface and ones of the probes, and the wiring substrate can comprise a first portion on which the electrical interface is disposed and a second portion composing the probe head assembly. The second portion of the wiring substrate can be moveable with respect to the first portion of the wiring substrate.

20 Claims, 28 Drawing Sheets

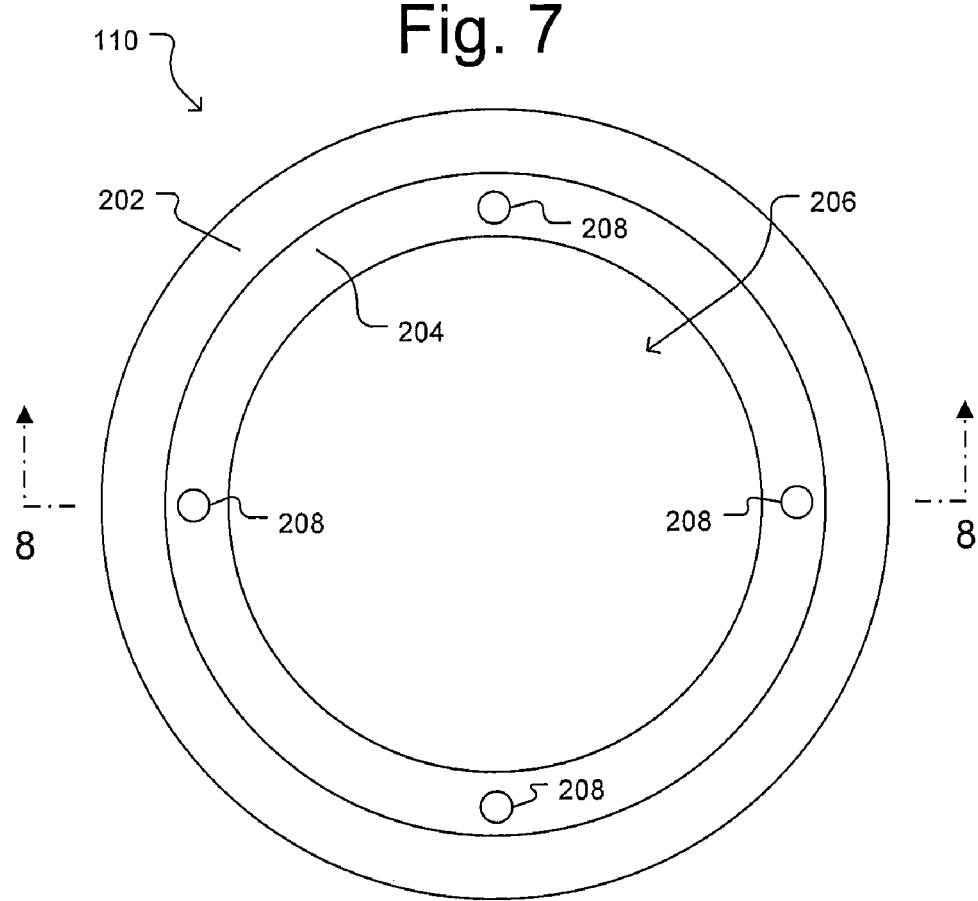
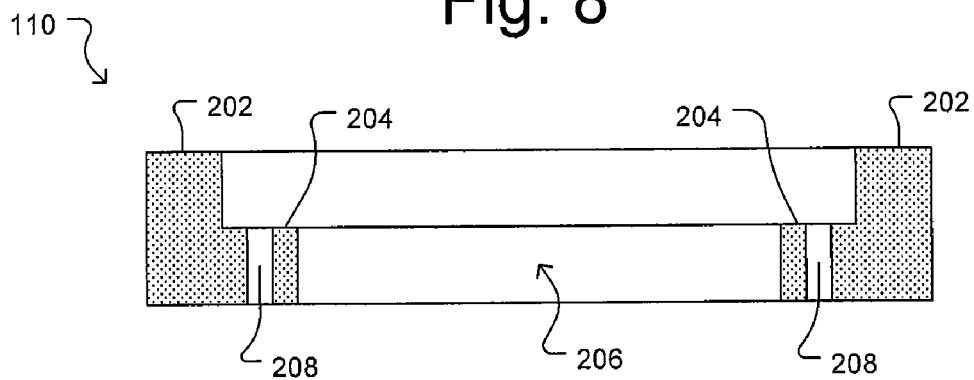

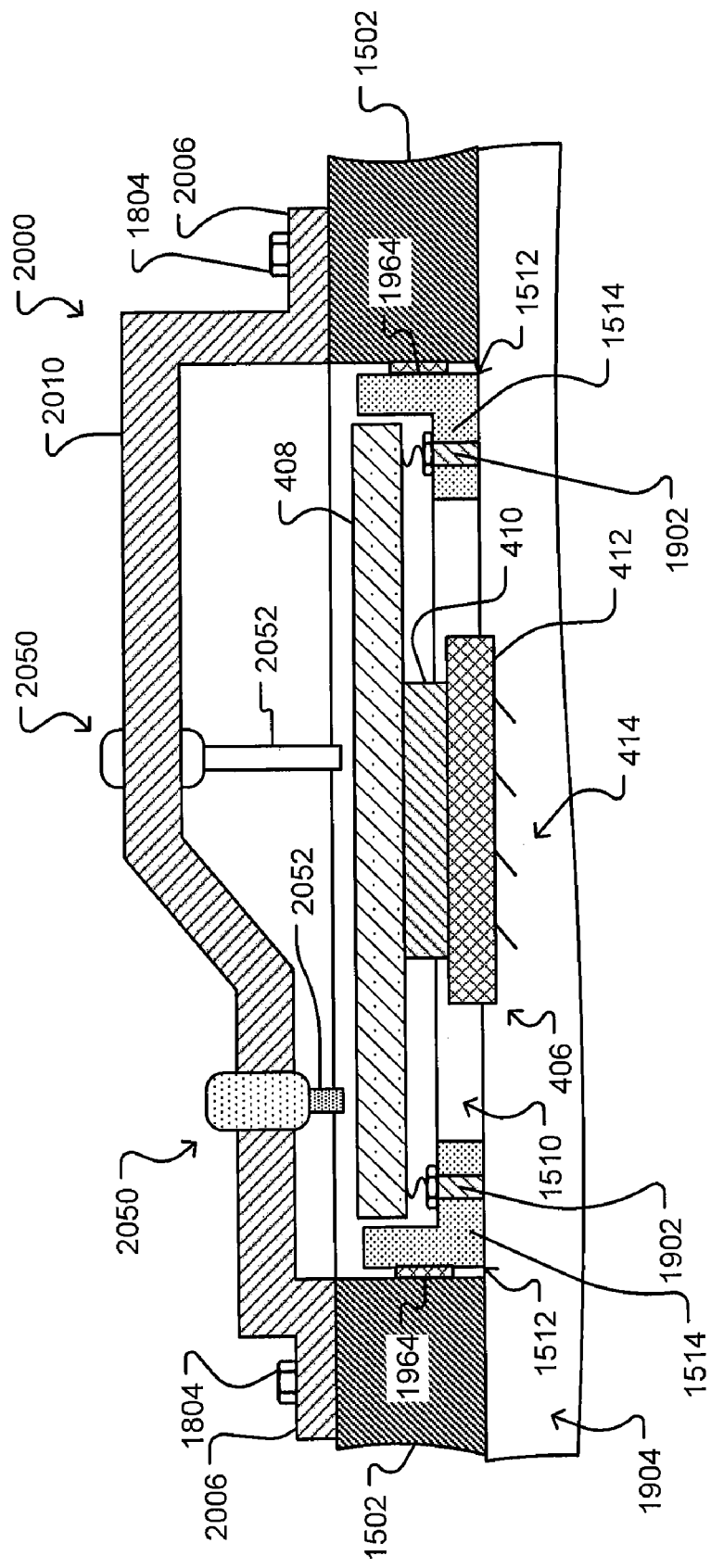

PROBE CARD ASSEMBLY WITH A MECHANICALLY DECOUPLED WIRING SUBSTRATE

CROSS-REFERENCE TO RELATED APPLICATION(S)

This application is a continuation-in-part of U.S. patent application Ser. No. 11/164,737, which was filed on Dec. 2, 2005.

BACKGROUND

An electronic device, such as a semiconductor die, can be tested by providing test signals to the device and monitoring the response of the device to the test signals. The test signals can be provided to the electronic device through electrically conductive probes that are temporarily pressed against terminals of the electronic device. Response signals generated by the device can similarly be sensed by electrically conductive probes temporarily pressed against terminals of the electronic device. Where multiple probes are pressed against multiple terminals of an electronic device, contact between the probes and the terminals can be facilitated by orienting the probes to correspond to an orientation of the terminals. For example, the terminals can lay in a configuration that defines a surface with a particular shape (e.g., a plane or an approximate plane), in which case contact between the probes and the terminals can be facilitated by orienting the probes to lie in a configuration that defines a surface with a similar shape.

DESCRIPTION OF THE DRAWINGS

FIG. 7 illustrates a top view of the insert ring of the prober of FIG. 6.

FIG. 8 illustrates a side, cross-sectional view of the insert ring of FIG. 7.

FIG. 20 shows an alternative docking and adjustment assembly and probe card assembly that can be used in place of the docking and adjustment assembly and probe card assembly of FIG. 19 according to some embodiments of the invention.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein.

Figure 1:
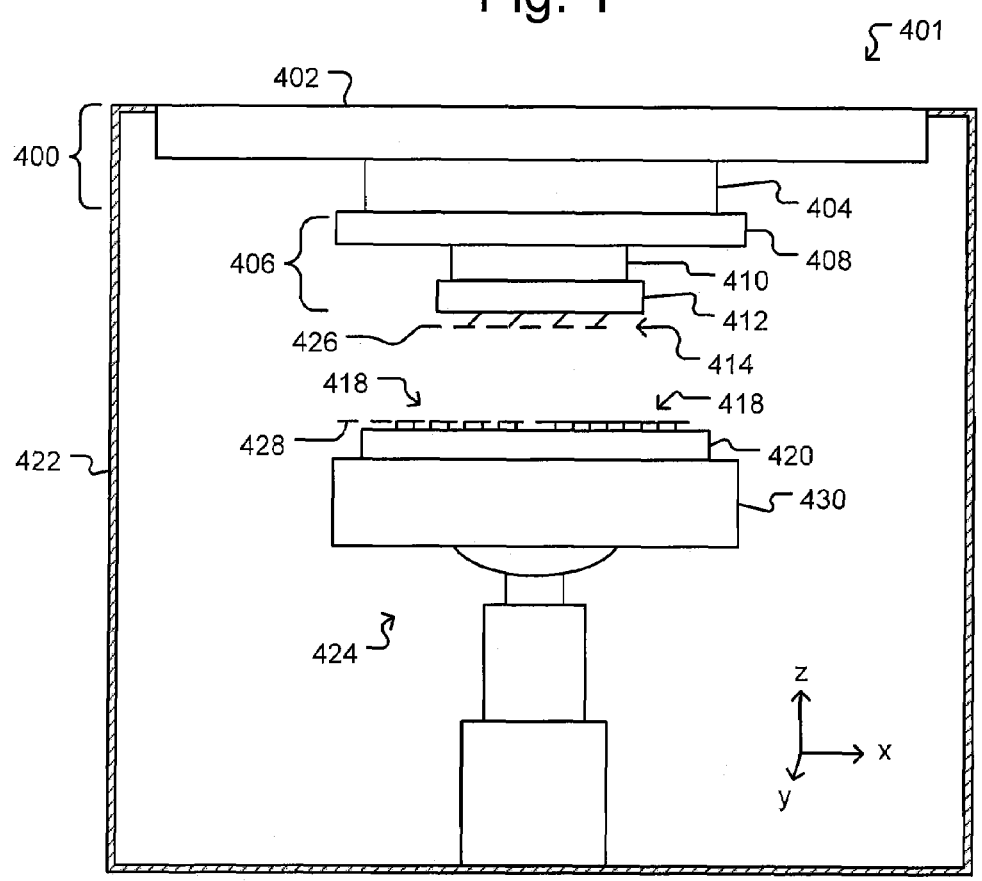
FIG. 1 illustrates an exemplary test system for testing one or more electronic devices according to some embodiments of the invention.

FIG. 1 illustrates a portion of an exemplary test system 401 for testing one or more electronic devices or DUTs 420 according to some embodiments of the invention. (As used herein, "DUT," "electronic device under test," and "electronic device to be tested," refer to one or more electronic devices to be tested or being tested, and non-limiting examples of such electronic devices include one or more dies of an unsingulated semiconductor wafer, one or more semiconductor dies singulated from a wafer (packaged or unpackaged), one or more dies of an array of singulated semiconductor dies disposed in a carrier or other holding device, one or more multi-die electronics modules, one or more printed circuit boards, and any other type of electronic device or devices.) As shown, test system 401 can include a housing 422 that encloses a moveable chuck 424, a docking and adjustment assembly 400, and a probe card assembly 406.

Probe card assembly 406 can include electrically conductive probes 414 configured to contact input and/or output terminals 418 of DUT 420 and thereby make temporary electrical connections with terminals 418. Probes 414 can be a resilient, conductive structure. Non-limiting examples of suitable probes 414 include composite structures formed of a core wire bonded to a conductive terminal (not shown) on a probe substrate 412 that is over coated with a resilient material as described in U.S. Pat. No. 5,476,211, U.S. Pat. No. 5,917,707, and U.S. Pat. No. 6,336,269. Probes 414 can alternatively be lithographically formed structures, such as the spring elements disclosed in U.S. Pat. No. 5,994,152, U.S. Pat. No. 6,033,935, U.S. Pat. No. 6,255,126, U.S. Patent Application Publication No. 2001/0044225, and U.S. Patent Application Publication No. 2001/0012739. Other non-limiting examples of probes 414 include conductive pogo pins, bumps, studs, stamped springs, needles, buckling beams, etc. Indeed, probes 414 can be any structure suitable for making electrical connections with a DUT.

Probe card assembly 406 also can include an electrical interface (not shown) to a tester (not shown), which generates test data to be input into DUT 420 and analyzes response data generated by DUT 420 in response to the test data to determine whether DUT 420 functions properly. Such testers are well known in the field and can comprise a computer or computer system (not shown). Internal electrical paths (not shown) in probe card assembly 406 electrically connect the tester interface (not shown) to probes 414.

Docking and adjustment assembly 400 provides a mechanism for mounting a probe card assembly 406 in housing 422 and for adjusting an orientation of probe card assembly 406. Chuck 424 can include a stage 430 for holding DUT 420 during testing. Chuck 424 can be moveable in the "x," "y," and "z" directions and can also be tilted and rotated. (Directional components are provided in FIG. 1 and throughout the drawings and this specification for convenience and ease of discussion only but not by way of limitation.) In operation, DUT 420 is placed on stage 430, and chuck 424 is moved to align terminals 418 of DUT 420 with probes 414, after which chuck 424 moves terminals 418 into contact with probes 414, which establishes temporary, pressure based electrical connections between probes 414 and DUT terminals 418. As discussed above, while electrical connections are established between probes 414 and terminals 418, test data can be input through probes 414 to DUT 420, and response data generated by DUT 420 can be read from DUT 420 through probes 414. The response data can then be analyzed to determine whether DUT 420 functions properly.

In order to establish electrical connections with terminals 418, contact tips (e.g., the portion of probes 414 configured to contact terminals 418) of probes 414 should be generally co-oriented with terminals 418. (In FIG. 1, a surface (which may correspond generally to a plane or an approximate plane) defined by the contact tips of probes 414 is depicted by dashed line 426, and a surface (which may correspond generally to a plane or an approximate plane) defined by terminals 418 is depicted by dashed line 428.) Although the surface 426 of the contact tips of probes 414 can be out of orientation with the surface 428 of terminals 418 to some degree, if the surface 426 of the contact tips of probes 414 is too far out of orientation with the surface 428 of terminals 418, an electrical connection may not be made between one or more probes 414 and one or more corresponding terminals 418, or even if an electrical connection is made, the electrical connection can have too high a resistance for test and/or response data to pass reliably between probes 414 and terminals 418. In such a case, a fully functional DUT 420 can test as bad.

The exemplary test system 401 shown in FIG. 1 can include two mechanisms for adjusting the orientation (e.g., the shape of a surface defined by the tips of probes 414, such as the planarity or approximate planarity) of contact tips of probes 414. First, probe card assembly 406 can include a planarizing mechanism 410, and second, docking and adjustment assembly 400 can include an adjustment mechanism 404. As will be seen, both planarizing mechanism 410 of probe card assembly 406 and adjustment mechanism 404 of docking and adjustment assembly 400 can adjust an orientation (e.g., the shape of a surface defined by the tips of probes 414, such as the planarity or approximate planarity) of probes 414.

Referring first to probe card assembly 406, as shown in FIG. 1, probe card assembly 406 can include a mounting fixture 408, a planarizing mechanism 410, and a probe substrate 412. The mounting fixture 408 can be configured to attach probe card assembly 406 to docking and adjustment assembly 400. Mounting fixture 408 can comprise a rigid or elastic structure and can perform functions in addition to attaching probe card assembly 406 to docking and adjustment assembly 400. For example, a rigid mounting fixture 408 can also function as a stiffener configured to resist bending, warping, bowing, etc. of the probe card assembly 406. As another example, mounting fixture 408 can comprise a wiring board that can include the interface (not shown) to the tester mentioned above. Alternatively, probe card assembly 406 can include a wiring board (not shown) containing the tester interface (not shown) that is separate and distinct from the mounting fixture 408. In one exemplary embodiment, mounting fixture 408 can comprise a metal plate or a metal truss structure.

As also shown in FIG. 1, probes 414 can be attached to probe substrate 412, which can be any suitable substrate configured to support probes 414 and provide electrical connections to the probes 414. For example, probe substrate 412 can comprise a ceramic, organic, or printed circuit board substrate comprising electrically conductive pads (not shown) on one surface of the substrate and internal conductive paths connecting those pads to terminals (not shown) on another surface of the substrate. Probes 414 can be attached to the pads or the terminals.

Planarizing mechanism 410 is configured to allow selective adjustment of the orientation of probe substrate 412, and thus the contact tips of probes 414, with respect to mounting fixture 408. Planarizing mechanism 410 can also provide other functions, such as attaching probe substrate 412 to mounting fixture 408 and providing electrical paths to and from probe substrate 412.

Figure 2:
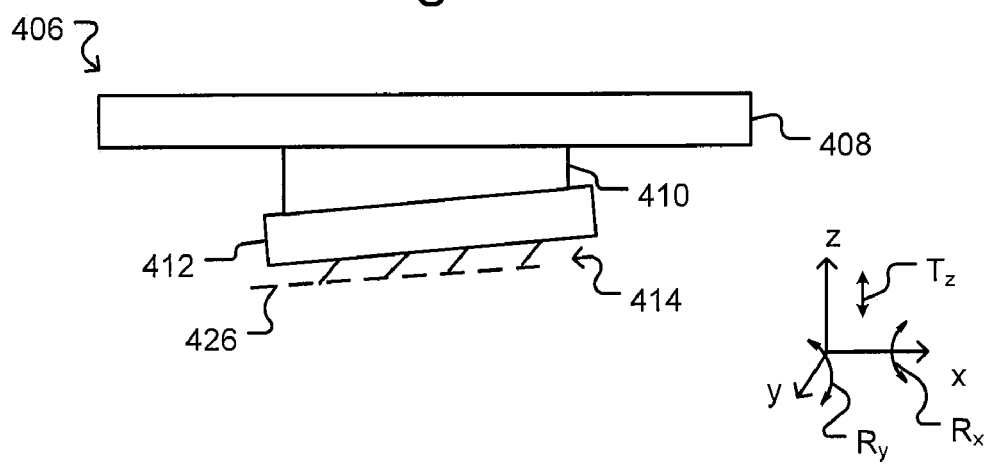
FIGS. 2 and 3 illustrate selective adjustment of the orientation of the probe substrate of a probe card assembly with respect to a mounting fixture of the probe card assembly of FIG. 1.
Figure 3:
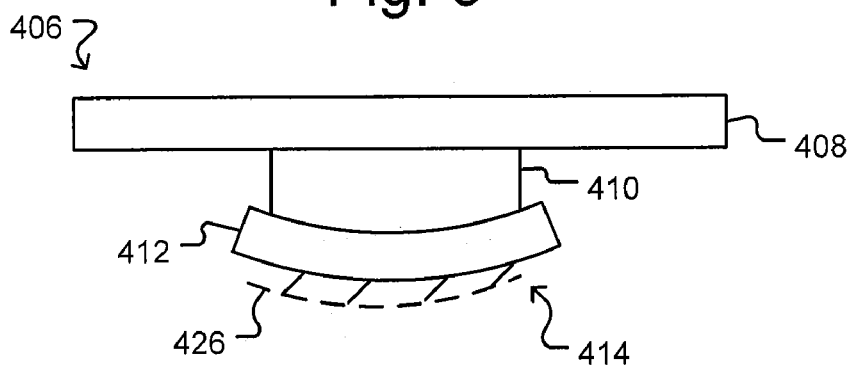
Figure 27:
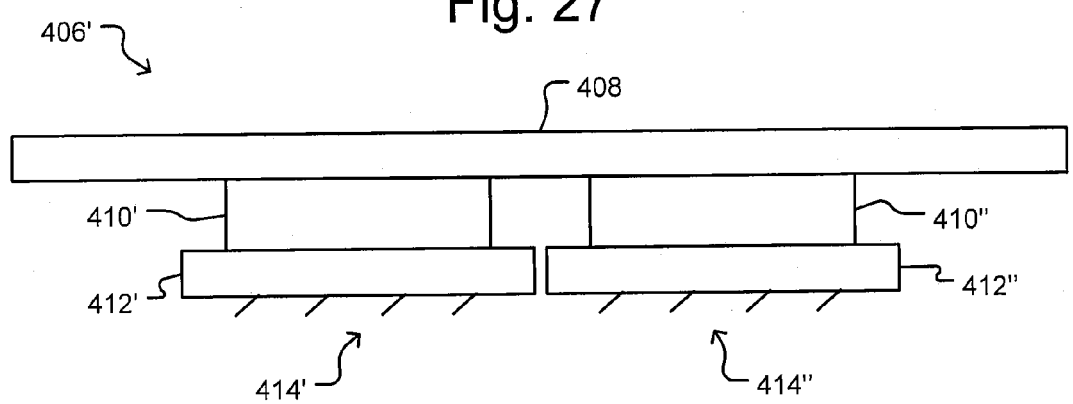
FIG. 27 illustrates an exemplary probe card assembly that include a plurality of probe substrates and planarizing mechanisms.

Probe card assembly 406 is shown in FIGS. 1-3, among other figures, as having one probe substrate 412 with one set of probes 414 for ease of illustrate and discussion. In some embodiments, probe card assembly 406 may be configured with more than one probe substrate 414, each comprising a set of probes 414. The probe substrates 414 can be disposed to form a large array of probes comprising the sets of probes 414 on each of the probe substrates. A simplified, non-limiting example of such a probe card assembly is illustrated in FIG. 27, which is discussed below. Other non-limiting examples of probe card assemblies with a plurality of probe substrates are shown in U.S. patent application Ser. No. 11/165,833, entitled "Method And Apparatus For Adjusting A Muti-Substrate Probe Structure," filed Jun. 24, 2005. Such probe card assemblies may be configured such that each probe substrate is individually moveable independent of the other probe substrate or probe substrates. For example, such a probe card assembly may include multiple planarizing mechanisms 410, which provide for independent movement and adjustment of the orientation of each individual probe substrate 412, such as is shown in FIG. 27. Alternatively, one planarizing mechanism 410 may provide for independent movement and adjustment of the orientation of each individual probe substrate 412. Moreover, if multiple planarizing mechanisms 410 are provided, there can be—but need not be—a one-to-one correspondence between the planarizing mechanisms 410 and the probe substrates 412.

FIGS. 2 and 3 illustrate selective adjustment of the orientation of a probe substrate 412 with respect to mounting fixture 408. As shown in FIG. 2, planarizing mechanism 410 is capable of selectively rotating ($R_x$ and $R_y$) a probe substrate 412 about the "x" and "y" axes and translating ($T_z$) a probe substrate 412 along the "z" axis. (Unless otherwise specified, in all depictions of an "x," "y," and "z" coordinate system throughout the drawings, the "x" axis runs horizontally on a page as depicted, and the "z" axis runs vertically on a page as depicted. The "y" axis, although shown slightly askew so that appears as more than a dot, runs perpendicular to (that is, into and out of) a page. As previously stated, directions stated herein are for clarity and ease of discussion and are not intended to be limiting.)

As shown in FIG. 3, planarizing mechanism 410 can alternatively or additionally be capable of altering a shape of probe substrate 412. For example, planarizing mechanism 410 can be configured to apply alternating and opposing forces to probe substrate 412 to alter the shape of probe substrate, an example of which is shown in FIG. 3. Planarizing mechanism 410 is not limited to imparting a concave shape to probe substrate 412 but can impart many different shapes to probe substrate 412 including, without limitation, a convex shape or complex shapes that have multiple curves and/or changes of direction. Purely linear changes (as shown in FIG. 2)—as opposed to the curved changes shown in FIG. 3—can be made to probe substrate 412, or as another alternative, a combination of linear and curved changes can be made over a portion of a surface or an entire surface of probe substrate 412.

Planarizing mechanism 410 can be any mechanism suitable for altering an orientation of probe substrate 412 with respect to mounting fixture 408. For example, planarizing mechanism 410 can comprise actuators comprising a moveable element, such as a moveable plunger or shaft. As another example planarizing mechanism 410 can comprise differential screw assemblies. Moreover, planarizing mechanism 410 can be manually or machine driven, and planarizing mechanism 410 can be activated at the planarizing mechanism 410 itself or by remote control. In addition, as discussed below with respect to FIGS. 23 and 24, cameras or other sensors can determine positions of probes 414 and provide control signals to planarizing mechanism 410 to adjust automatically the orientation of probes 414.

As discussed above, although not shown in FIGS. 2 and 3, probe card assembly 406 may include multiple probe substrates 412 each having a set of probes 414 and configured on probe card assembly 406 to form a large array of probes comprising the sets of probes 414 disposed on each of the probe substrates 412. As also discussed above, in such a case, planarizing mechanism 410 may be configured to provide for independent movement and adjustment of each of the probe substrates 412. Alternatively, probe card assembly 406 may include multiple planarizing mechanisms 410 configured to provide for independent movement and adjustment of each of the probe substrates 412. Other configurations are also possible.

Figure 9:
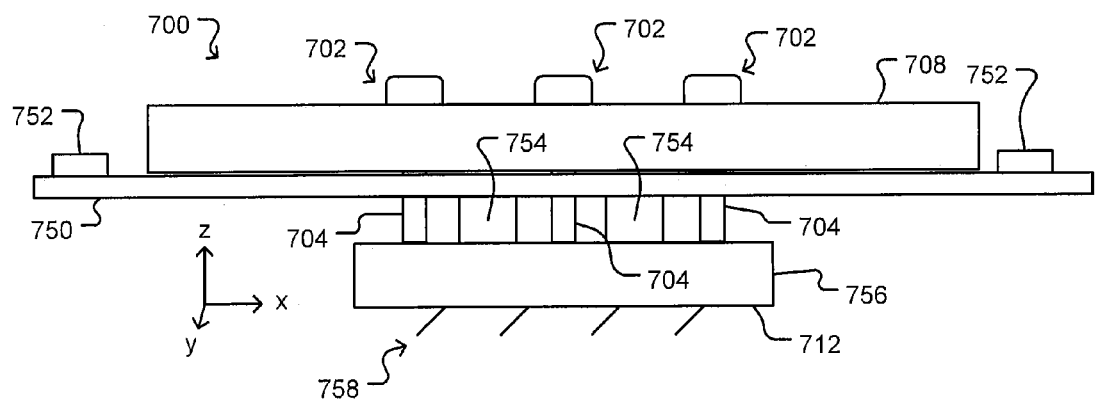
FIG. 9 illustrates an exemplary probe card assembly according to some embodiments of the invention.

As will be seen, non-limiting, exemplary embodiments of probe card assembly 406 are shown in FIGS. 9 and 27. As will be discussed, actuators 702 of FIG. 9 are exemplary embodiments of planarizing mechanism 410, and stiffener 708 is an exemplary embodiment of mounting fixture 408. As also discussed below, other non-limiting, exemplary embodiments of probe card assembly 406 are disclosed in U.S. Pat. No. 5,974,662, entitled "Method Of Planairizing Tips Of Probe Elements Of A Probe Card Assembly"; U.S. Pat. No. 6,509,751, entitled "Planarizer For A Semiconductor Contactor; and the aforementioned U.S. patent application Ser. No. 11/165,833.

Planarizing mechanism 410 thus can change an orientation of probe substrate 412 with respect to mounting fixture 408. Because probes 414 are attached to probe substrate 412, planarizing mechanism 410 thus can adjust a surface 426 defined by contact tips of probes 414 and set the planarity of the contact tips of probes 414 in a desired orientation with respect to mounting fixture 408.

The probe card assembly 406 thus can select a particular orientation of probes 414 with respect to mounting fixture 408 (before or after the probe card assembly 408 is placed in housing 422). For example, the selected orientation of probes 414 can be such that the tips of probes 414 define a surface with a particular shape (e.g., a plane or an approximate plane). After the probe card assembly 406 is attached to the docking and adjustment assembly 400, however, the orientation of probes 414 set by planarizing mechanism 410 may not correspond exactly to an orientation of terminals 418 of DUT 420. For example, as mounted to docking and adjustment assembly 400, probe card assembly 406 can be tilted or askew due to, for example, non-planarities or structural imperfections in the docking and adjustment mechanism 400, chuck 424, and/or other elements of test system 401.

Referring now to docking and adjustment mechanism 400, as shown in FIG. 1, docking and adjustment mechanism 400 can include a reference structure 402 and an adjustment mechanism 404 according to some embodiments of the invention.

Reference structure 402 can comprise any structure already existing in housing 422 or attached to housing 422 that is capable of functioning as a reference to which an orientation of probe card assembly 406 can be adjusted by adjustment mechanism 404, which as will be seen, can comprise manually or machine driven actuators. Reference structure 402 can be rigid or flexible and can have an even or an uneven reference surface (not shown).

Adjustment mechanism 404 can be any mechanism suitable for altering an orientation of probe card assembly 406 while probe card assembly 406 is mounted in housing 422 or, alternatively, before the probe card assembly 406 is mounted in housing 422. For example, adjustment mechanism 404 can comprise actuators comprising a moveable element, such as a moveable plunger or shaft. As another example adjustment mechanism 404 can comprise differential screw assemblies. Moreover, adjustment mechanism 404 can be manually or machine driven, and adjustment mechanism 404 can be activated at the adjustment mechanism itself or by remote control. As will be seen, several non-limiting exemplary, including actuators 702 of FIG. 9, are disclosed herein, and such actuators may comprise differential screw assemblies or other structures having a moveable element, plunger, or element. Another exemplary embodiment of adjustment mechanism 404 can include a plurality of wiffle tree structures (not shown).

Adjustment mechanism 404 can thus change an orientation of probe card assembly 406 with respect to reference structure 402 after probe card assembly 406 has been mounted in and attached to housing 422, although in some configurations, adjustment mechanism 404 can change an orientation of probe card assembly 406 before probe card assembly 406 is mounted in and attached to housing 422. Adjustment mechanism 404 is thus able to adjust further a surface 426 defined by the contact tips of probes 414 and set the orientation of the contact tips of probes 414 in a desired orientation with respect to reference structure 402. The adjustment mechanism 404 can adjust the orientation of the contact tips of probes 414 that were previously planarized by planarizing mechanism 410 to compensate for non-planarities or structural irregularities arising from the mounting (including structures involved in the mounting) of probe card assembly 406 in housing 422.

Either or both of reference structure 402 and adjustment mechanism 404 can be configured to perform additional functions. For example, either or both of reference structure 402 and adjustment mechanism 404 can attach mounting fixture 408 of probe card assembly 406 to housing 422. Alternatively, other structures or fixtures (not shown) can attach mounting fixture 408 of probe card assembly to housing 422.

Figure 4:
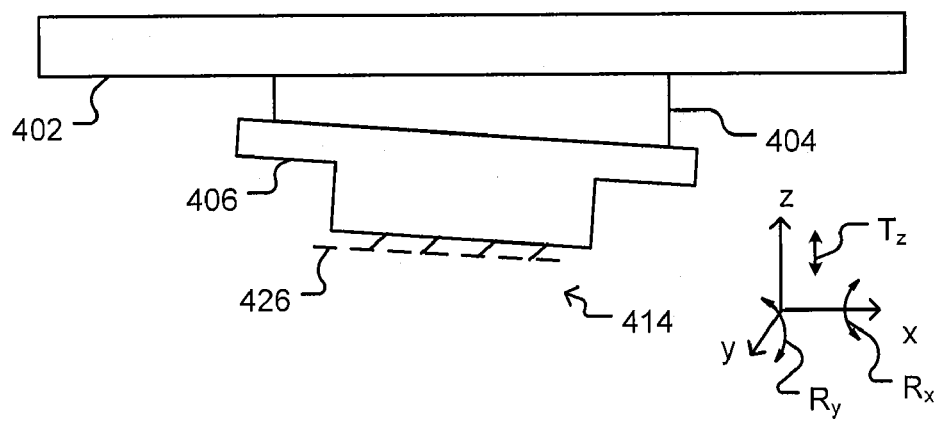
FIGS. 4 and 5 illustrate selective adjustment of the orientation of the probe card assembly with respect to reference structure in the test system of FIG. 1.
Figure 5:
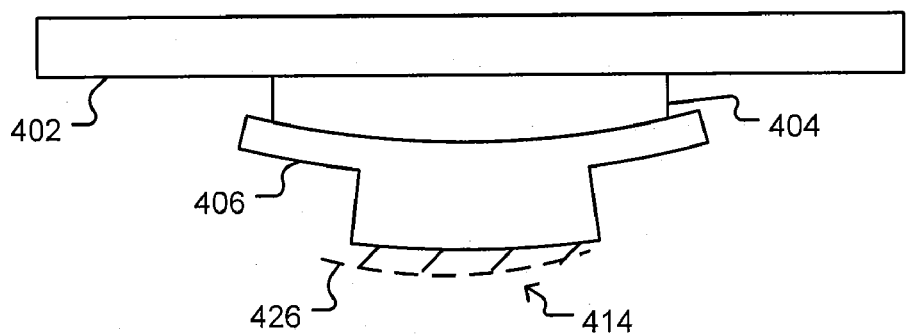

FIGS. 4 and 5 illustrate selective adjustment of the orientation of probe card assembly 406 with respect to reference structure 402. As shown in FIG. 4, adjustment mechanism 404 can selectively rotate ($R_x$ and $R_y$) probe card assembly 406 about the "x" and "y" axes and translate ($T_z$) probe card assembly 406 along the "z" axis.

As shown in FIG. 5, adjustment mechanism 404 can alternatively or additionally alter a shape of probe card assembly 406. For example, adjustment mechanism 404 can be configured to apply alternating and opposing forces to probe card assembly 406 (or to a particular element or elements of probe card assembly 406) that alter the shape of probe card assembly 406, an example of which is shown in FIG. 5. Adjustment mechanism 404 is not limited to imparting a concave shape to probe card assembly 406 but can impart many different shapes to probe card assembly 406 including, without limitation, a convex shape or complex shapes that have multiple curves and/or changes of direction. Purely linear changes (as shown in FIG. 4)—as opposed to the curved changes shown in FIG. 5—can be made to probe card assembly 406, or as another alternative, a combination of linear and curved changes can be made.

FIGS. 6-21B illustrate specific exemplary (though non-limiting) embodiments of docking and adjustment assembly 400 and probe card assembly 406, which are shown and described with reference to a test system 101 for testing DUT 120, which may be any type of DUT described above. As will be seen, test system 101 can include a prober 122, which is a non-limiting example of a housing 422.

Figure 6:
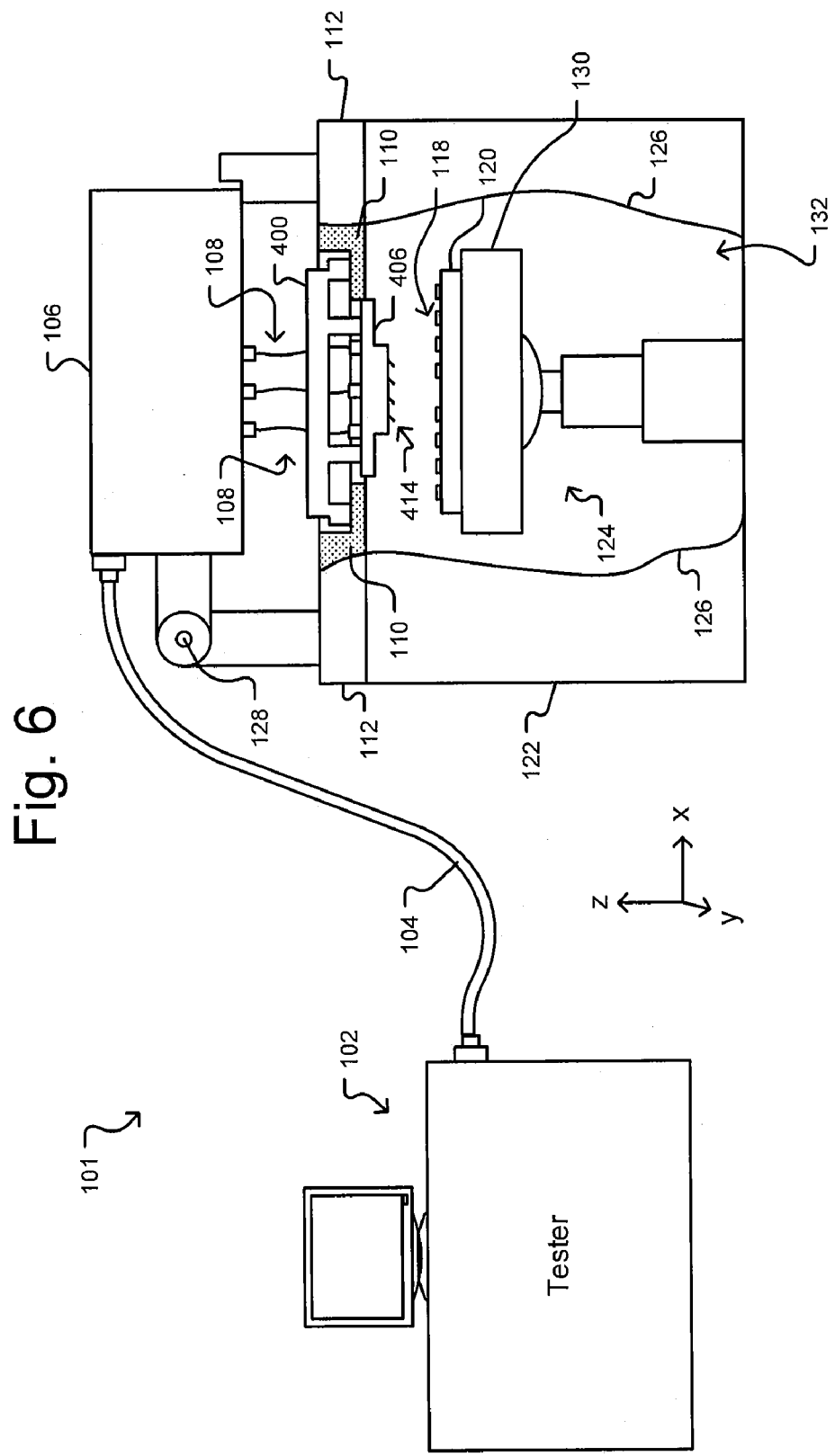
FIG. 6 illustrates an exemplary test system for testing dies of a semiconductor wafer according to some embodiments of the invention.

Referring first to the exemplary test system 101 illustrated in FIG. 6, the test system 101 is for testing DUT 120 according to some embodiments of the invention. As shown, the test system 101 can include a prober 122, which can be a box structure with an interior chamber 132 in which is disposed a movable chuck 124 having a stage 130 for holding DUT 120. (Cut out 126 in FIG. 6 provides a partial view into chamber 132.) Prober 122 can be similar to housing 422, chuck 124 can be similar to chuck 424, and stage 130 can be similar to stage 430 of FIG. 1. In some embodiments, some of the functions performed by tester 102 can be implemented in electronics (not shown) in test head 106 and/or on probe card assembly 406. Indeed, in some embodiments, tester 102 can be eliminated entirely and replaced with electronics in test head 106 and/or disposed on probe card assembly 406.

A head plate 112, which can be a solid, rigid plate-like structure, can be disposed on prober 122 and can form an upper boundary of chamber 132. Head plate 112 can include an insert ring 110 configured to hold, in normal operation, a probe card assembly 406. Electrical connectors 108 provide electrical connections between a test head 106 and probe card assembly 406, which can include electrically conductive probes 414. Probe card assembly 406 also can include electrically conductive paths (not shown in FIG. 6) between connectors 108 and probes 414.

In normal operation, a probe card assembly 406 is typically bolted, clamped, or otherwise secured to insert ring 110. FIGS. 7 and 8 illustrate a top view and a cross-sectional, side view, respectively, of insert ring 110. As shown, insert ring 110 can be generally annular in shape and can include a shoulder portion 202 and a ledge 204 with bolt holes 208. In normal operation, a probe card assembly 406 can be disposed on ledge 204 with probes 414 extending out of a central opening 206 of insert ring 110, and bolts (not shown) or other securing mechanisms (e.g., clamps) can secure probe card assembly 406 to insert ring 110.

Referring again to FIG. 6, chuck 124 can include a stage 130 on which DUT 120 can be disposed. Chuck 124 can move in the "x," "y," and "z" directions, and can also tilt about the "x" and "y" axes and rotate about the "z" axis. Chuck 124 thus can align particular input and/or output terminals 118 (e.g., bond pads of a semiconductor die or dies) of DUT 120 with particular probes 414 and press those particular terminals 118 against those particular probes 414 to establish temporary electrical connections between the terminals 118 and the probes 414.

A tester 102, which can be a computer or a computer system, can provide test data to DUT 120 and analyze response data generated by DUT 120 in response to the test data. Communications cable 104 can provide a plurality of electrical data paths between tester 102 and test head 106, and test head 106 can include internal switches and other data routing elements that electrically connect the data paths provided by cable 104 with electrical connectors 108. A plurality of data channels can thus be provided between tester 102 and probes 414 through which test data from tester 102 is provided to DUT 120 and response data generated by DUT 120 in response to the test data is provided to tester 102. A rotatable arm assembly 128 can rotate test head 106 into and out of the position of the test head 106 shown in FIG. 6, which is a test position in which test head 106 is in position to test DUT 120. Cable 104 and other elements of test system 101 can be replaced in whole or in part with wireless communications devices (not shown), and as discussed above, some or all of the functions performed by tester 102 can be implemented in test head 106 and/or with electronics disposed on probe card assembly 406.

As generally discussed above with respect to FIG. 1, if the action of bringing a set of DUT 420 terminals 418 and a set of probes 414 into contact is to establish electrical connections between each of the probes 414 in the set and each of the DUT terminals 118 in the set, sufficient co-orientation should be established between the portions of probes 414 that contact terminals 118 and terminals 118. That is, prior to testing DUT 120, the positions of probes 414 should be adjusted, as needed, to put contact portions of probes 414 into an orientation (e.g., defining a surface with a particular shape, such as a plane or an approximate plane) that generally corresponds to an orientation (e.g., defining a surface with a particular shape, such as a plane or an approximate plane) of terminals 118. Moreover, during testing, the foregoing orientation of probes 414 with respect to terminals 118 should be maintained. Otherwise, it is possible that one or more probes 414 will not make physical contact—and thus not establish an electrical connection or electrical connections—with corresponding one or more terminals 118. As another possibility, it is possible that the force with which one or more probes 414 is pressed against corresponding one or more terminals 118 will be too weak to establish an electrical connection or electrical connections with a sufficient level of electrical conductivity. As discussed above, probe card assembly 406 and docking and adjustment assembly 400 can provide separate and distinct mechanisms for adjusting the orientation of probes 414 to correspond to an orientation of terminals 118.

As will be discussed below with respect to FIGS. 27-30, planarizing mechanism 410 can correct mis-orientations of probes 414 caused by irregularities and imperfections in elements of the probe card assembly 406. Examples of such irregularities and imperfections (as will be discussed with respect to FIGS. 27-30) include without limitation irregularities and imperfections in probe substrate 412, probes 414, and the mechanism (e.g., planarizing mechanism 410) that attaches probe substrate 412 to mounting fixture 408. Such irregularities and imperfections may be due to, for example, manufacturing variances. Planarizing mechanism 410 can correct such mis-orientations of probes 414 and precisely orient probes 414 with respect to a reference structure (e.g., mounting fixture 408) of probe card assembly 406.

No matter how precisely probes 414 are oriented with respect to mounting fixture 408, irregularities and imperfections in the testing apparatus (e.g., housing 422, stage 430, reference structure 402 in FIG. 1; head plate 112, insert ring 110, or stage 130 in FIG. 6) can give rise to mis-orientation of probes 414 with respect to DUT terminals 418, 118 while probe card assembly 406 is mounted in the testing apparatus. Adjustment mechanism 404 can substantially reduce and/or eliminate such mis-orientations of probes 414 with respect to DUT terminals 418, 118 caused by irregularities or imperfections in the testing apparatus to within acceptable tolerances depending on the desired result or testing situation.

FIGS. 9-12 illustrate an exemplary embodiment 700 of probe card assembly 406 according to some embodiments of the invention, which can be used in test system 101. As shown, probe card assembly 700 can comprise a stiffener 708, a wiring board 750, a probe substrate 756 with probes 758, and a plurality of actuators 702. As will be seen, stiffener 708 is one example of mounting fixture 408 and actuators 702 are one example of planarizing mechanism 410. Probe substrate 756 can be generally similar to probe substrate 412 of FIG. 1, and probes 758 can be generally similar to probes 414.

Figure 10:
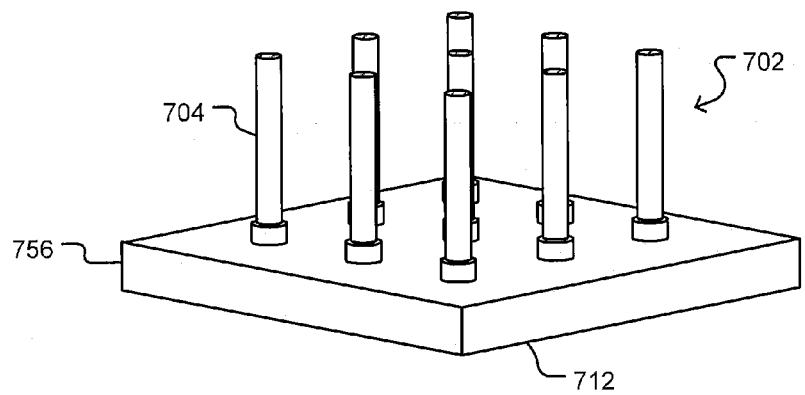
FIGS. 10-12 illustrate the probe substrate of the probe card assembly of FIG. 9.
Figure 11:
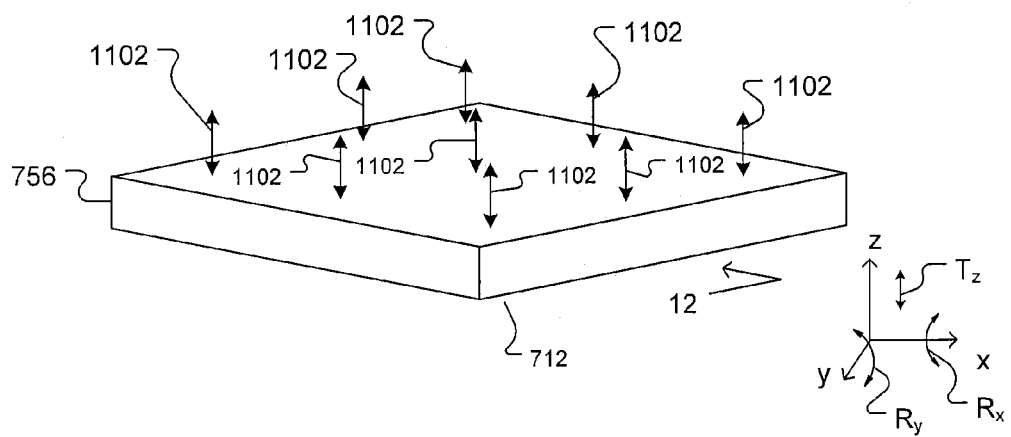
Figure 12:
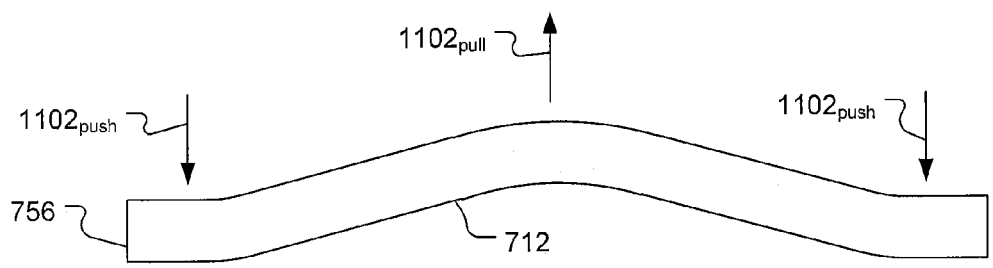

Each actuator 702 can include a moveable element 704. In the example shown in FIG. 9, each actuator 702 is attached to stiffener 708, and the moveable element 704 of each actuator 702 extends through holes (not shown) in stiffener 708 and wiring board 750 and are attached to probe substrate 756. Each moveable element 704 can be selectively moved away from or toward probe substrate 756. As a moveable element 704 is moved away from probe substrate 756, the moveable element 704 pulls the portion of probe substrate 756 to which the moveable element 704 is attached toward stiffener 708. On the other hand, as a moveable element 704 is moved toward probe substrate 756, the moveable element 704 pushes the portion of probe substrate 756 to which the moveable element 704 is attached away from stiffener 708. Each actuator 702 can thus selectively exert a push or pull force on a particular area of probe substrate 756. As shown in FIGS. 10 and 11, by utilizing a plurality of actuators 702 (nine are shown in FIG. 10 but more or fewer can be used), a plurality of push/pull forces 1102 can be applied to probe substrate 756. By selective activation of moveable elements 704, probe substrate 756 can thus be rotated ($R_x$ and $R_y$) about the "x" and/or "y" axes and translated ($T_z$) along the "z" axis. Moreover, by applying alternating push and pull forces 1102 as shown in FIG. 12, a shape of a surface 712 of probe substrate 756 can be altered. (Although not shown in FIGS. 10-12, probes 758 are attached to surface 712 of probe substrate 756.) Shapes other than the concave shape shown in FIG. 12 can be imparted to surface 712. For example, a convex shape or complex shapes that have multiple curves and/or changes of direction can be imparted to surface 712. Purely linear changes—as opposed to the curved changes shown in FIG. 12—can be made to surface 712, or as another alternative, a combination of linear and curved changes can be made.

The configuration and type of actuators 702 used is not important and many different types of actuators can be used. For example, actuators 702 can comprise differential screw assemblies that can be generally immovably attached to stiffener 708. Moveable elements 704 can be shaft portions of differential screw assemblies that are moved toward probe substrate 756 as a drive head (not shown) of the differential screw assembly is rotated in one direction and retract away from probe substrate 756 as the drive head is rotated in the other direction. As another non-limiting example, actuators 702 can comprise a housing that is attached to stiffener 708 and moveable element 704 can be a plunger or piston that can be moved in and out of the housing.

Other examples of actuators 702 include, without limitation, differential screw assemblies 404 and 2708, leveling screw assemblies 1504, and alignment/planarizing assemblies 2408 of the aforementioned U.S. patent application Ser. No. 11/165,833. FIGS. 5A-5C of the aforementioned U.S. Pat. No. 6,509,751 also illustrate examples of actuators that can be used as actuator 702. Referring again to FIG. 9, moveable element 704 can be moved using any suitable mechanism, including without limitation machine driven mechanisms such as hydraulics, motors, and piezoelectric actuators, and manually driven mechanisms such as a differential screw assembly.

Moveable element 704 need not be attached to probe substrate 756. For example, moveable element 704 can simply abut probe substrate 756, which can be attached to stiffener 708 with a spring mechanism that biases probe substrate 756 toward stiffener 708. In such a configuration, as moveable element 704 is moved toward probe substrate 756, moveable element 704 pushes a portion of probe substrate 756 away from stiffener 708. As moveable element 704 is moved away from probe substrate 756, the spring mechanism (not shown)

pushes probe substrate 756 toward stiffener 708 until probe substrate 756 abuts against and is stopped by moveable element 704. An example of suitable actuators and the use of such actuators is shown in FIG. 5 of the aforementioned U.S. Pat. No. 5,974,662. As yet another possible variation, some of moveable elements 704 can be attached to probe substrate 756 and others can simply abut probe substrate 756. An example of such a configuration is shown in FIG. 2 of the aforementioned U.S. Pat. No. 6,509,751.

Referring again to FIG. 9, probe card assembly 700 also can include a wiring board 750 with connectors 752 for receiving connectors 108 from test head 106 (see FIG. 6). Electrical paths (not shown) are provided from connectors 752 through wiring board 750 to flexible electrical connectors 754 and through probe substrate 756 to probes 758. Flexible electrical connectors 754 can comprise flexible wires, one or more interposers mounted in brackets (not shown), etc.

Figure 13:
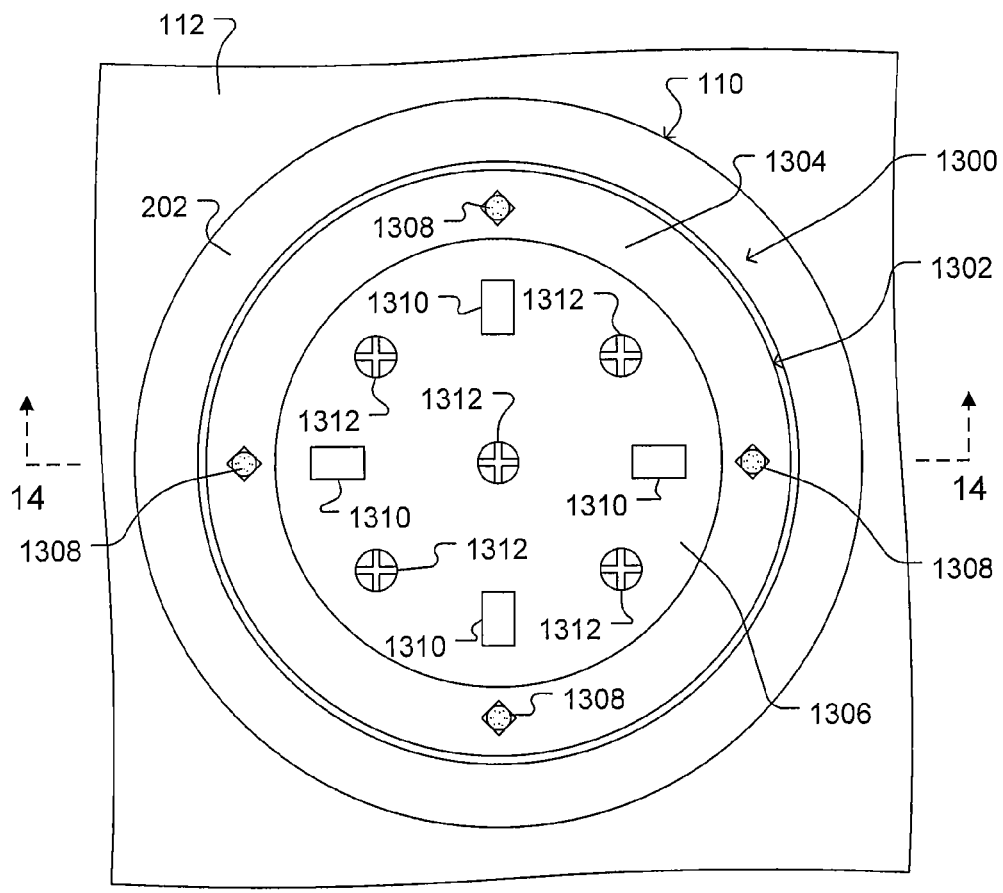
FIG. 13 illustrates a top view of an exemplary embodiment of a docking and adjustment assembly shown with partial views of the head plate and insert ring of the test system of FIG. 6 according to some embodiments of the invention.
Figure 14:
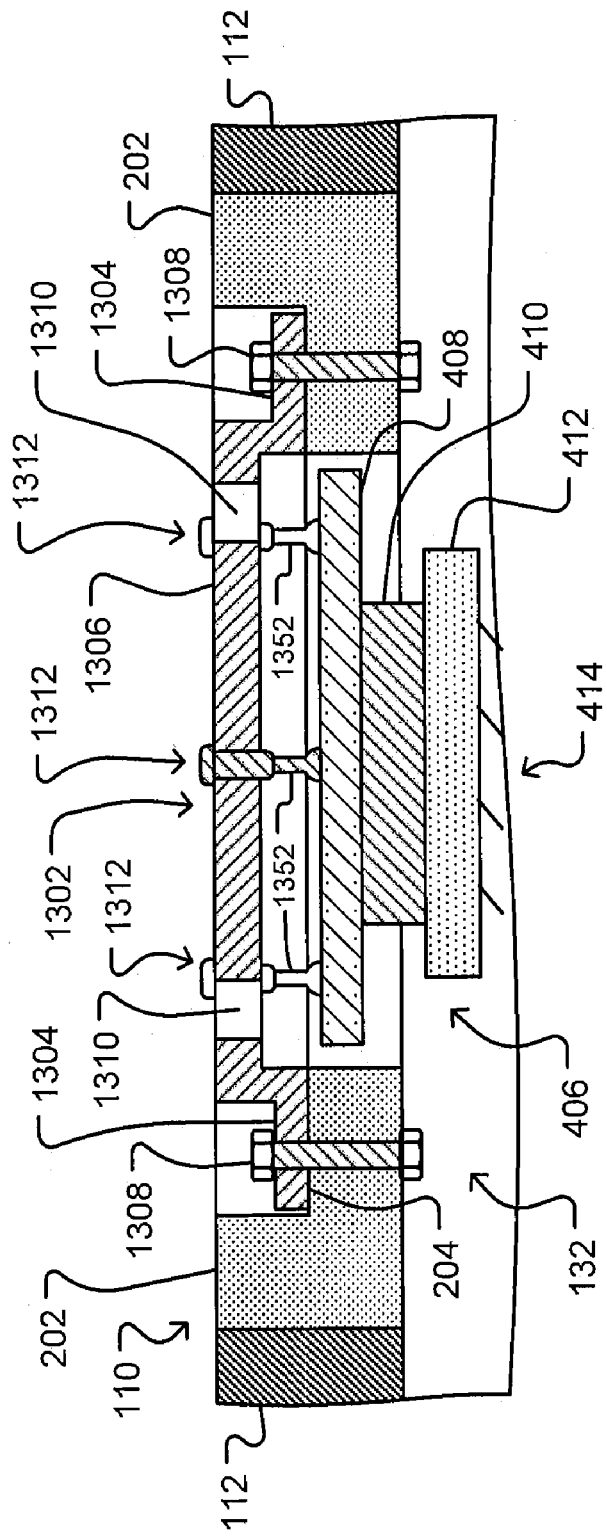
FIG. 14 shows a side, cross-sectional view of the docking and adjustment assembly of FIG. 13 with a probe card assembly.

FIGS. 13 and 14 illustrate an exemplary embodiment 1300 of docking and adjustment mechanism 400 of FIG. 1, which can be used in test system 101. FIG. 13 shows a top view of docking and adjustment mechanism 1300, which is shown attached to insert ring 110 of FIG. 6. (The insert ring 110 and head plate 112 of FIG. 6 are shown in partial view in FIG. 13.) FIG. 14 shows a side, cross-sectional view of FIG. 13.

As shown in FIGS. 13 and 14, docking and adjustment mechanism 1300 can comprise a bridge 1302 and one or more actuators 1312 (five are shown in FIG. 13 but more or fewer can be used). Bridge 1302, which can be a generally annular structure comprising metal or other rigid materials, can include a flange 1304 and a plate 1306. Flange 1304 can include holes (not shown) through which bolts 1308 secure bridge 1302 to ledge 204 of insert ring 110 (see also FIGS. 6-8). Plate 1306 can include openings 1310 for connectors 108 (not shown in FIGS. 13 and 14), which as discussed above, can connect test head 106 to probe card 406. (See FIG. 6.) The bridge 1302 illustrated in FIGS. 13 and 14 is exemplary only and many variations are possible. For example (and without limitation), the general shape of bridge 1302 may be other than annular.

In the embodiment of docking and adjustment assembly 1300 shown in FIGS. 13 and 14, actuators 1312 are attached to both plate 1306 of docking and adjustment assembly 1300 and mounting fixture 408 of probe card assembly 406, which is shown in FIG. 14 as generically including at least a mounting fixture 408, a planarizing mechanism 410, a probe substrate 412, and probes 414 as previously discussed with regard to FIGS. 1-5. In the embodiment shown in FIGS. 13 and 14, actuators 1312 both attach probe card assembly 406 to docking and adjustment assembly 1300 and adjust an orientation of probe card assembly 406 with respect to bridge 1302. Thus, in the exemplary embodiment of docking and adjustment assembly 1300 shown in FIGS. 13 and 14, bridge 1302 is an exemplary implementation of reference structure 402 and actuators 1312 are an exemplary implementation of adjustment mechanism 404 of the docking and adjustment mechanism 400 of FIG. 1.

Actuators 1312, which can be generally similar to actuators 702, include a moveable element 1352, which can be generally similar to moveable element 704. In the example shown in FIGS. 13 and 14, actuator 1312 can be attached to plate 1306, and moveable element 1352 can be attached to mounting fixture 408. As moveable element 1352 is moved away from mounting fixture 408, moveable element 1352 pulls probe card assembly 406 towards bridge 1302. Moving element 1352 in the opposite direction, pushes probe card assembly 406 away from bridge 1302. By spacing a plurality of actuators 1312 about plate 1306 as shown in FIG. 13, probe card assembly 406 can be rotated about the "x" and/or "y" axes and translated along the "z" axis as generally shown in FIG. 4, among other figures. By applying pushing forces against probe card assembly 406 with one or more actuators 1312 and pulling forces with one or more other actuators 1312, the shape of probe card assembly 406 can be altered as generally shown in FIG. 5, among other figures.

The actuator 1312 can be attached to plate 1306 in any suitable manner. For example, a portion of each actuator 1312 can be threaded into a threaded opening (not shown) in plate 1306. As other examples, a portion of actuator 1312 can be welded, brazed, screwed, bolted, clamped, adhered, etc. to plate 1306. Moveable element 1352 can be attached to mounting fixture 408 in any suitable manner, including without limitation threaded into or welded, brazed, screwed, bolted, clamped, or adhered to mounting fixture 408.

Figure 15:
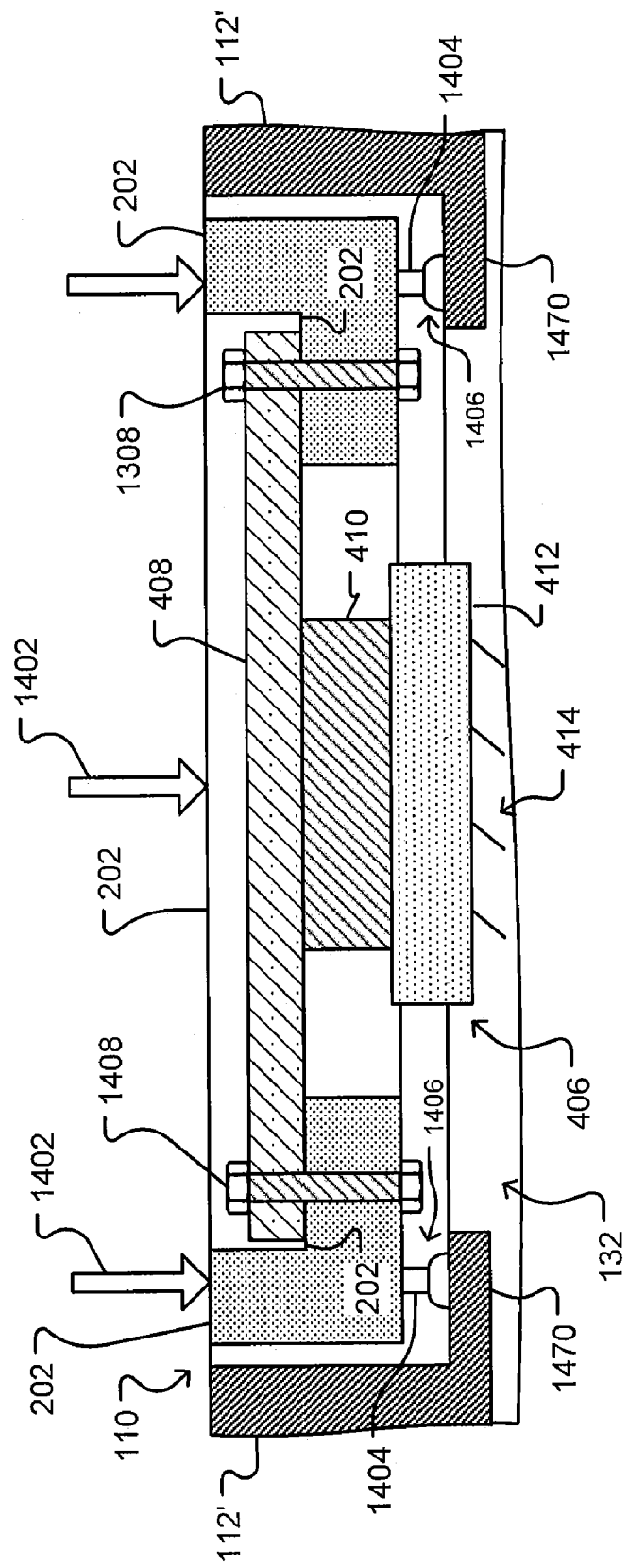
FIG. 15 illustrates a side, cross-sectional view of another exemplary embodiment of a docking and adjustment assembly shown with partial views of the head plate and insert ring according to some embodiments of the invention.

FIG. 15 illustrates a partial view of an alternative head plate 112' that can include shoulders 1470 according to some embodiments of the invention. A probe card assembly 406 can be fastened (e.g., with bolts 1408 or other fasteners, such as screws, clamps, etc.) to insert ring 110, as shown in FIG. 15. As also shown in FIG. 15, insert ring 110 can be disposed on actuators 1406 that are, in turn, disposed on shoulders 1470 of head plate 112'. The actuators 1406, which can be like actuators 702 or 1312 and include a moveable element 1404 (which can be like moveable element 704 or 1352) can move the insert ring 110 toward or away from shoulder 1470. By utilizing a plurality of such actuators 1406, an orientation of insert ring 110 (and thus probe card assembly 406) can be changed with respect to head plate 112'. In the example shown in FIG. 15, actuators 1406 can be attached to shoulders 1470, and moveable element 1404 can abut against insert ring 110. Biasing forces 1402 (e.g., springs disposed between insert ring 110 and test head 106 (see FIG. 6) can bias insert ring 110 toward shoulders 1470. Alternatively, actuators 1406 can be attached to insert ring 110, and moveable element 1404 can abut against shoulders 1470. As yet another alternative, moveable elements 1404 can be attached to insert ring 110 so that moveable elements 1404 can both push insert ring 110 away from shoulders 1470 and pull insert ring 110 toward shoulders 1470. In such a case, biasing forces 1408 need not be used.

Figure 16A:
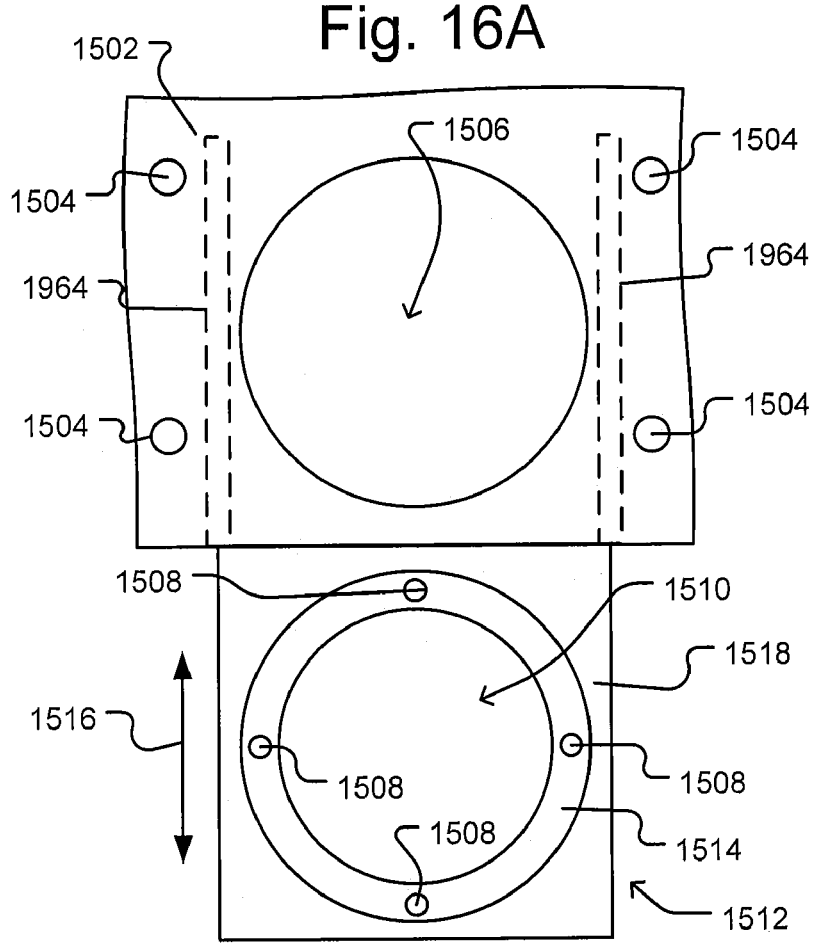
FIGS. 16A and 16B illustrate an alternative head plate and insert ring that can be used with the test system of FIG. 6 according to some embodiments of the invention.
Figure 16B:
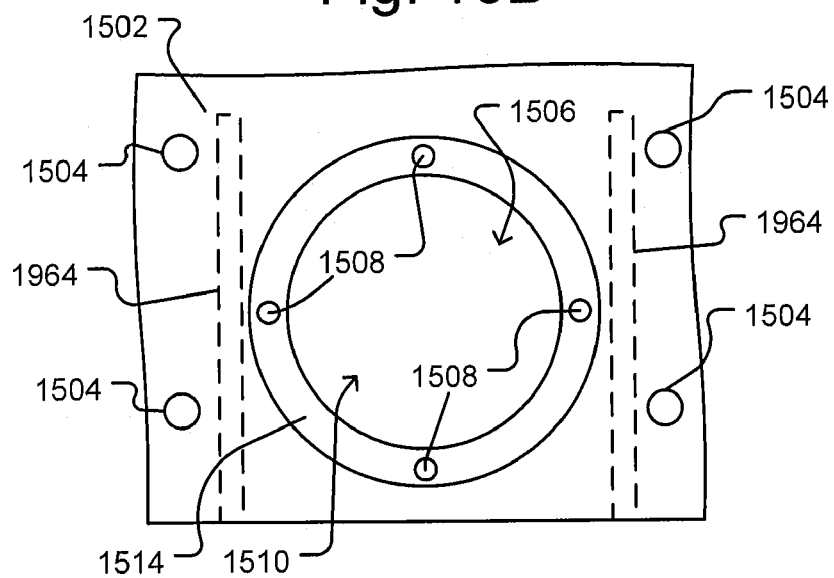
Figure 17:
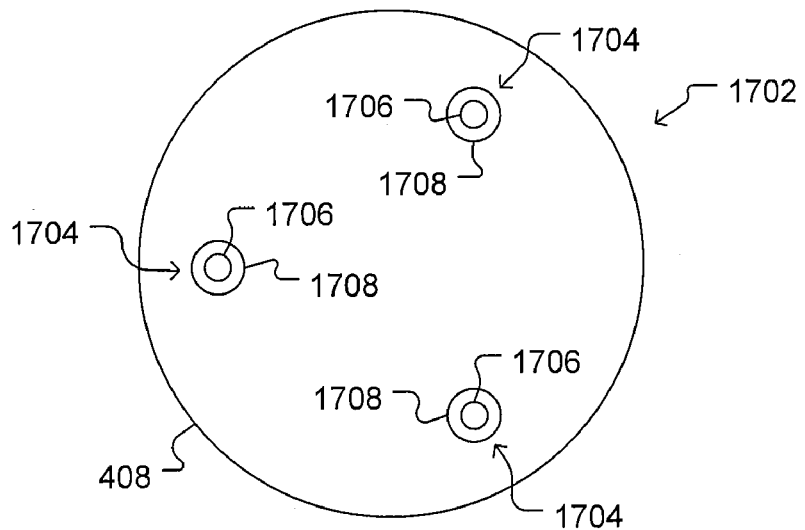
FIG. 17 illustrates a top view of an exemplary probe card assembly that can be used with the head plate and insert ring of FIGS. 16A and 16B.
Figure 18:
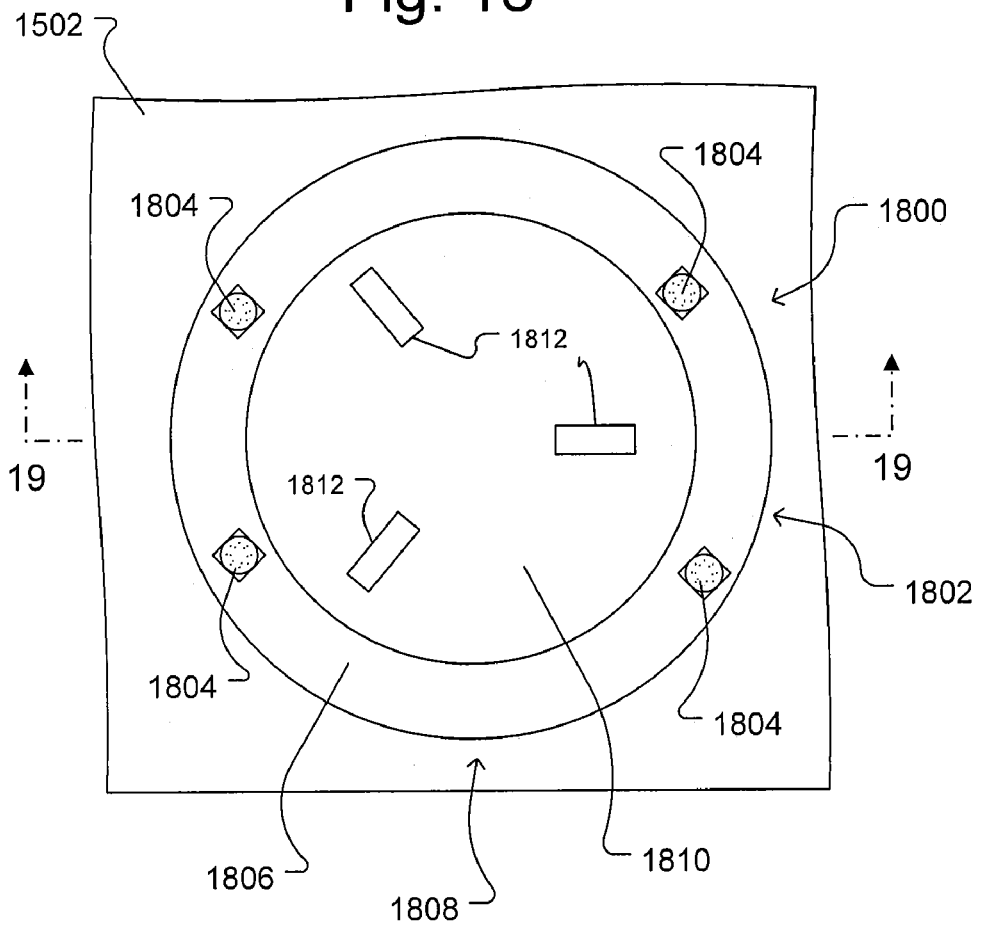
FIG. 18 illustrates a top view of an exemplary docking and adjustment assembly attached to the head plate and insert ring of FIGS. 16A and 16B, which are shown in partial view, according to some embodiments of the invention.
Figure 19:
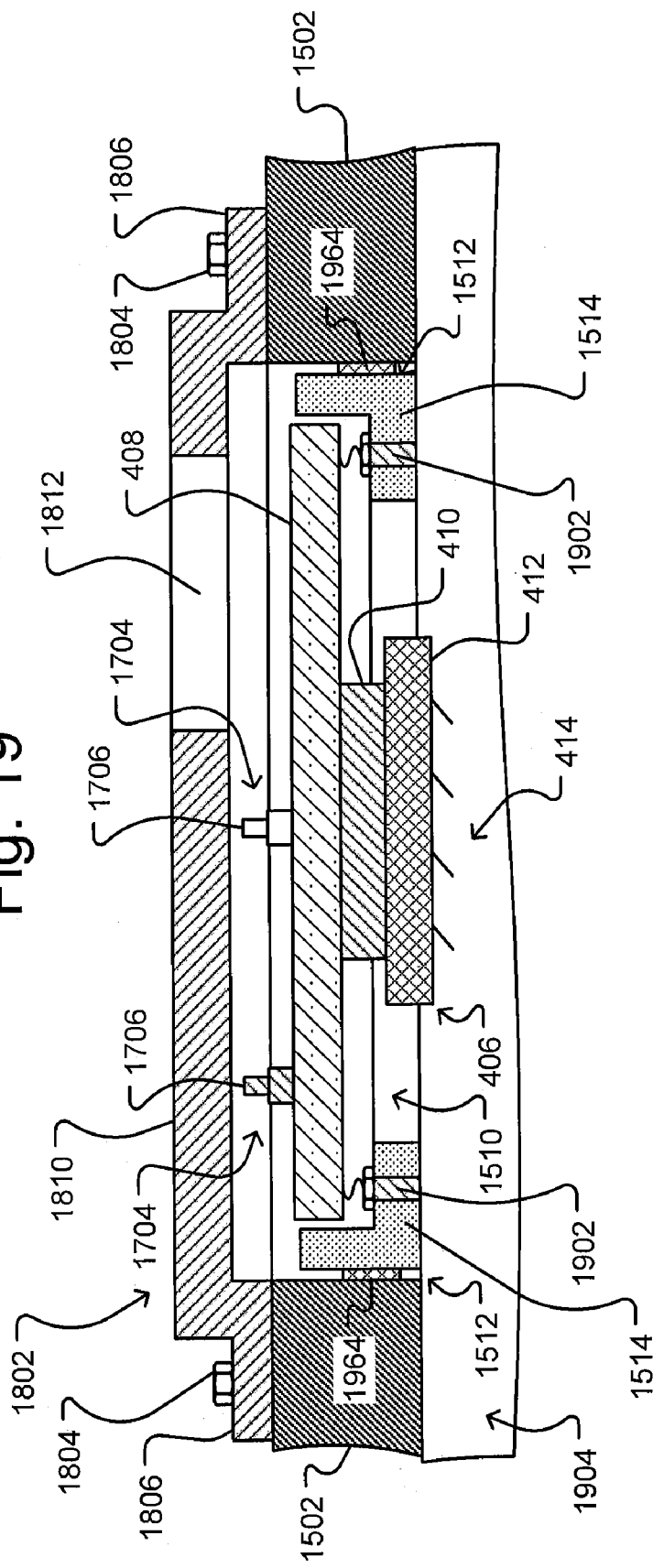
FIG. 19 shows a side, cross-sectional view of the docking and adjustment assembly of FIG. 18 with the probe card assembly of FIG. 17.

FIGS. 16A and 16B illustrate a partial view of yet another alternative head plate 1502 and insert ring 1512 that can be used in place of head plate 112 and insert ring 110 of FIG. 6, and FIGS. 17-19 illustrate an exemplary embodiment 1702 of probe card assembly 406 and an exemplary embodiment 1800 of docking and adjustment mechanism 400 that can be used with head plate 1502 and insert ring 1512 in test system 101 of FIG. 6 according to some embodiments of the invention. The probe card assembly 1702 shown in FIGS. 17-19 and the docking and adjustment assembly 1800 shown in FIGS. 18 and 19 are thus further exemplary embodiments of the probe card assembly 406 and docking and adjustment assembly 400 shown in FIGS. 1 and 6.

Referring first to FIGS. 16A and 16B, head plate 1502, which can include central opening 1506, can be generally similar to head plate 112 shown in FIG. 6. Insert ring 1512, however, can slide from an exposed position shown in FIG. 16A to a test position (shown in FIG. 16B) within an opening (not shown) in head plate 1502. A sliding mechanism 1964 along which insert ring 1512 can slide is shown in dashed lines in FIGS. 16A and 16B because sliding mechanism 1964 is hidden from view in FIGS. 16A and 16B. The sliding mechanism 1964 can comprise rails attached to head plate 1502 along which wheels, bearings, or other moveable mechanisms (not shown) attached to insert ring 1512 roll, slide, or otherwise move. Insert ring 1512 can include an opening 1510, ledge 1514 with holes 1508, and a shoulder 1518 generally like insert ring 110 of FIGS. 7 and 8.

In typical use, while insert ring 1512 is in the exposed position shown in FIG. 16A, a probe card assembly (not shown in FIGS. 16A and 16B) is placed on ledge 1514 with its probes (not shown) extending through opening 1510 (into the page in FIG. 16). Using bolt holes 1508, the probe card assembly is then bolted to ledge 1514, and insert ring 1512 is pushed into head plate 1502 into what is referred to above as a test position (shown in FIG. 16B). In the test position, insert ring 1512 is disposed within head plate 1502 and opening 1506 in head plate 1502 is generally aligned with opening 1510 in insert ring 1512. In the test position, the probe card assembly is ready to contact a DUT.

FIGS. 17-19 illustrate exemplary embodiments of a probe card assembly 1702 and docking and adjustment assembly 1800 configured for use in prober 122 (see FIG. 6) modified to comprise head plate 1502 and insert ring 1512 of FIGS. 16A and 16B according to some embodiments of the invention. More specifically, FIG. 17 shows a top view of probe card assembly 1702, and FIG. 18 shows a top view and FIG. 19 shows a side, cross-sectional view of probe card assembly 1702 and docking and adjustment assembly 1800 mounted in head plate 1502 and insert ring 1512, each of which is shown in partial view only.

As shown in FIGS. 17 and 19, probe card assembly 1702 comprises a mounting fixture 408, planarizing mechanism 410, probe substrate 412, and probes 414, which can be as described above with respect to FIG. 1. As also shown, a plurality of actuators 1704 are attached to mounting fixture 408 of probe card assembly 406. (Three actuators 1704 are shown in the exemplary configuration illustrated in FIGS. 17-19 (the view illustrated in FIG. 19 shows only two of the three actuators 1704) but fewer or more can be used.) Each actuator 1704 can be generally similar to any of actuators 702, 1312, 1406 and can include a moveable element 1704, which can be generally similar to moveable element 704, 1352, 1404. In the example shown in FIGS. 17-19, actuators 1704 can be attached to mounting fixture 408, and moveable element 1706 can abut against plate 1810. (Actuator 1704 can be attached to mounting fixture 408 in any suitable manner, including without limitation any of the attachment methods described above for attaching actuator 1312 to plate 1306.)

As shown in FIGS. 18 and 19, docking and adjustment assembly 1800 comprises a bridge 1802, which can be generally annular in shape and comprise a flange 1806 and plate 1810. Bridge 1802 can comprise metal or other such materials. Flange 1806 can include holes (not shown) for bolts 1804 that bolt bridge 1800 to head plate 1502 through holes 1504 in head plate 1502. (See FIG. 16.) Bridge 1802 can include openings 1812 for connectors 108, which as discussed above with respect to FIG. 6, can electrically connect test head 106 to probe card assembly 406.

Referring to FIGS. 16-19, in use, spring plugs 1902 can be inserted (e.g., threaded) into holes 1508 in ledge 1514 of inset ring 1512. Insert ring 1512 is moved to the exposed position shown in FIG. 16A, and probe card assembly is placed onto the springs of spring plugs 1902, which provide a biasing force that pushes probe card assembly 406 in the direction of bridge 1802. Alternatively, spring plugs 1902 can be attached to insert ring 1512. With moveable elements 1706 of actuators 1704 generally retracted, insert ring 1512 is moved into the test position (shown in FIG. 16B), which as described above and shown in FIG. 16B, is generally inside head plate 1502. Moveable elements 1706 of actuators 1704 are then extended such that they press against plate 1810. By selective activation of actuators 1704, probe card assembly can be rotated about the "x" and/or "y" axes and also translated in either direction along the "z" axis as generally shown in FIG. 4. A shape of probe card assembly 406 can also be altered as generally shown in FIG. 5.

Actuators 1704 can be actuated (e.g., moveable element 1706 moved) in any suitable manner including without limitation any of the ways discussed above for actuating actuator 1312 of FIG. 15. In addition, actuators 1704 can be placed on plate 1810 rather than on mounting fixture 408. For example, actuators 1704 can be attached to the lower (with respect to FIG. 19) surface of plate 1810 with shafts 1706 extending downward (with respect to FIG. 19) to contact the upper (with respect to FIG. 19) surface of mounting fixture 408.

FIG. 20 illustrates exemplary variations of bridge 1802 of FIGS. 17-19. FIG. 20 is generally the same as FIG. 19 except, in FIG. 20, bridge 2000 replaces bridge 1802 and actuators 2050 replace actuators 1704. As shown, bridge 2000 can include a flange 2006 that can be generally similar to flange 1806 and a plate 2010 that can be generally similar to plate 1810 except that plate 2010 does not present an even or flat surface to probe card assembly 406. Each actuator 2050 can be similar to any of actuators 702, 1312, 1406, 1704 and can include a moveable element 2052 that can be selectively advanced toward mounting fixture 408 and thus push probe card assembly 406 away from plate 2010, or retracted away from mounting fixture 408, allowing springs of spring plugs 1902 to push probe card assembly 406 toward plate 2010. Again, by selective use of a plurality of such actuators 2050, probe card assembly 406 can be rotated about the "x" and/or "y" axes and translated in either direction along the "z" axis as shown in FIG. 4.

Figure 21A:
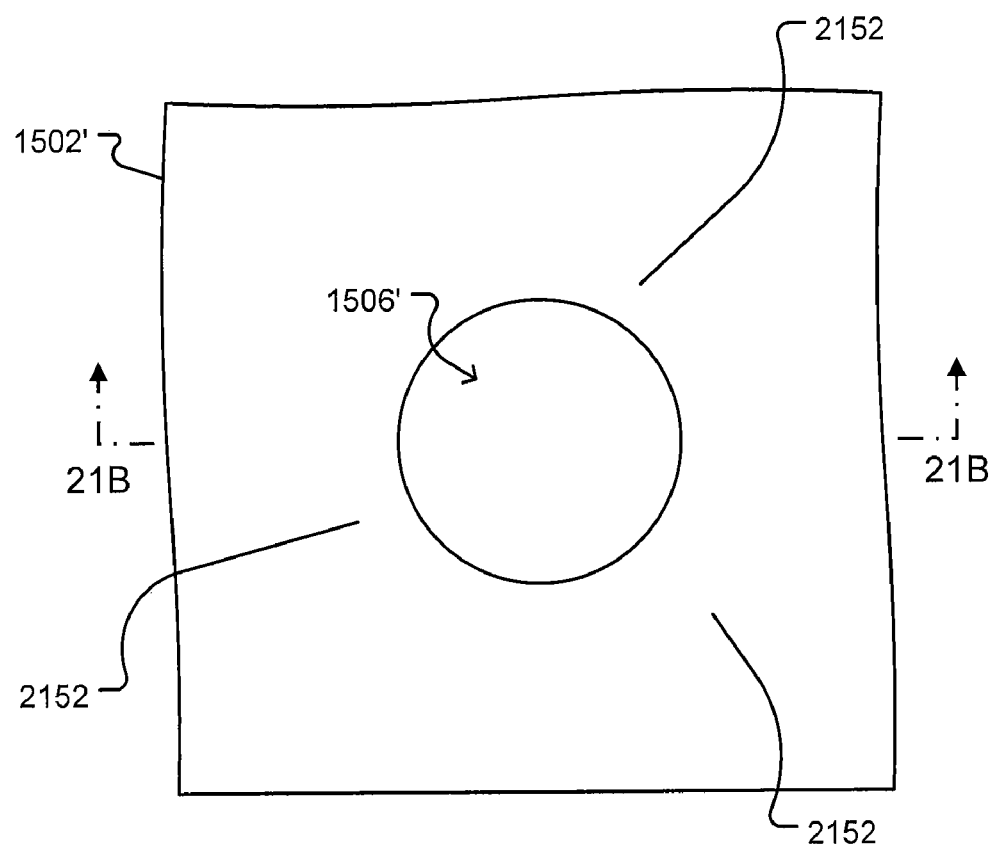
FIG. 21A shows a top view and FIG. 21B shows a side, cross-sectional view of an alternative version of the head plate and insert ring of FIGS. 16A and 16B and a probe card assembly with a docking and adjustment assembly that can be used with the alternative version of the head plate and insert ring according to some embodiments of the invention.
Figure 21B:
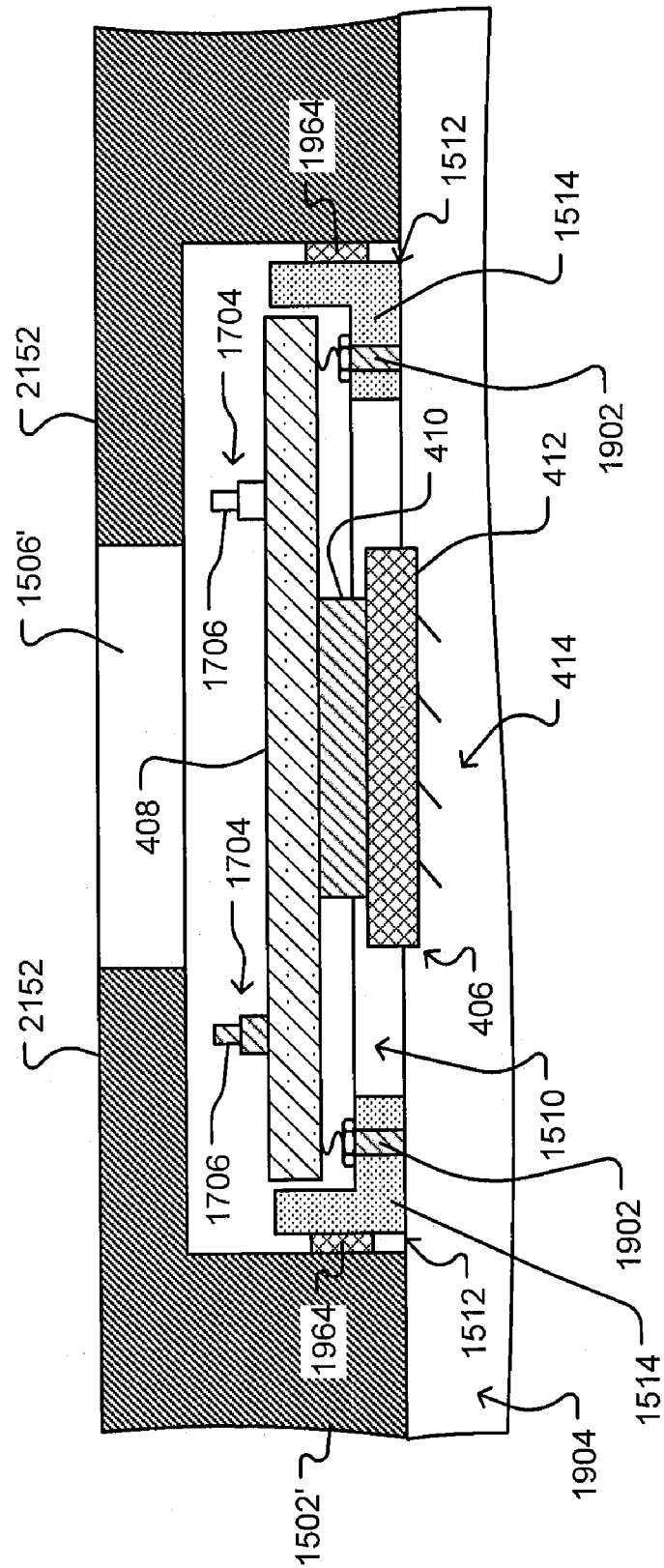

FIGS. 21A (top view) and 22B (side, cross-sectional view) illustrate still another alternative head plate 1502', insert ring 1512, and probe card assembly 406 according to some embodiments of the invention. Insert ring 1512 and probe card assembly 406, which includes actuators 1704, can be generally the same as shown in FIG. 19. Head plate 1502' can also be generally similar to head plate 1502 of FIG. 19, except head plate 1502' includes extension portion 2152 as shown in FIGS. 21A and 21B. Because of extension portion 2152, bridge 1802 (see FIG. 19) is not needed, and extension portion 2152 generally replace bridge 1802 of FIG. 19. That is, moveable elements 1706 of actuators 1704 can abut against extension portion 2152 and selectively push portions of probe card assembly 406 away from extension portion 2152 against the biasing force of spring plugs 1902. As discussed above, spring plugs 1902 can alternatively be attached to probe card assembly 406 (e.g., to mounting fixture 408).

Figure 22:
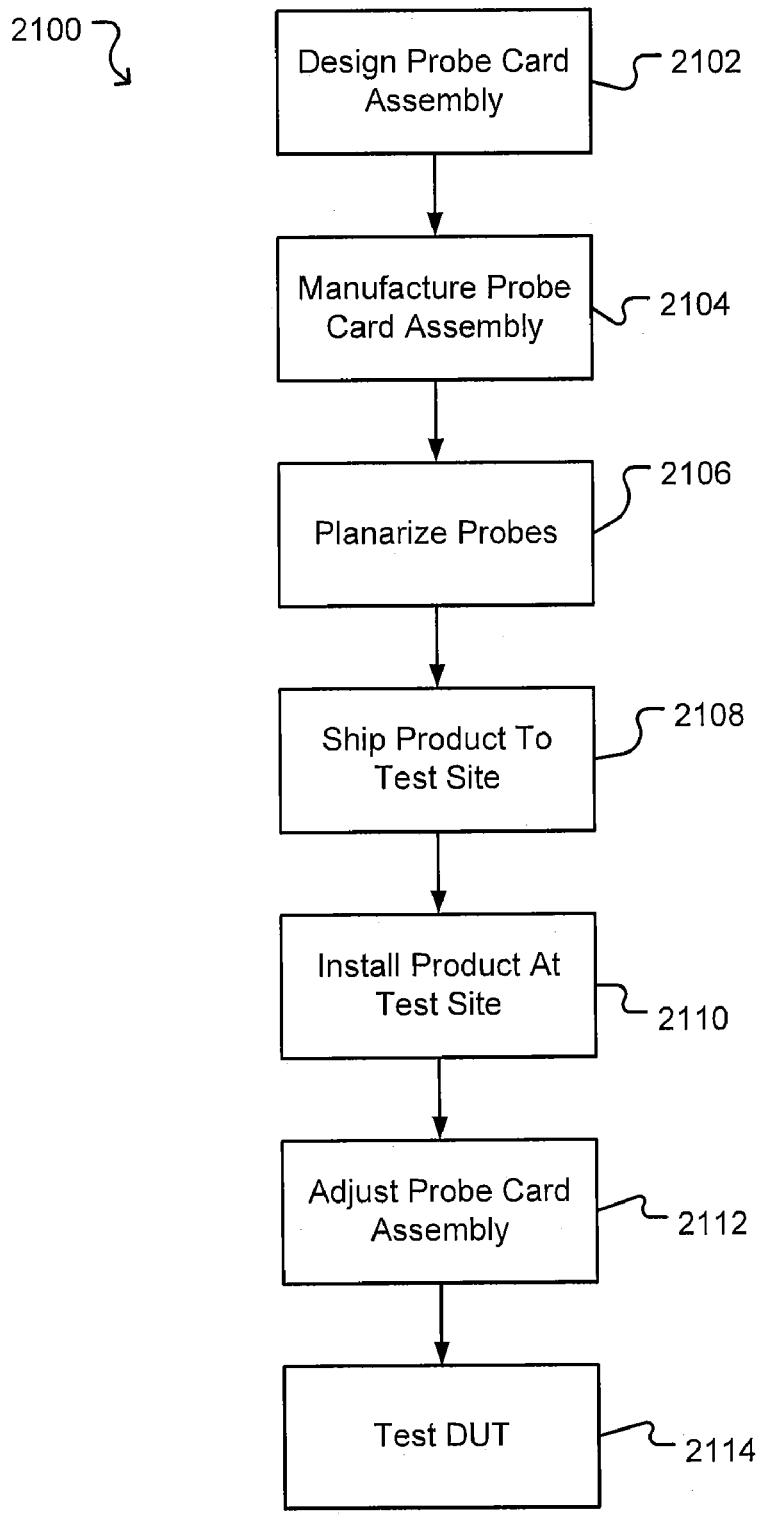
FIG. 22 illustrates an exemplary process for designing, making, and using a probe card assembly according to some embodiments of the invention.

FIG. 22 illustrates an exemplary process 2100 for designing, making, and using a probe card assembly, such as probe card assembly 406. As shown, process 2100 begins with designing the probe card assembly 406 (2102), which can include, among other things, laying out probes to correspond to the input and/or output terminals 418 of DUT 420. Typically, a probe 414 can be provided for each DUT terminal 418, and the probes 414 can be laid out in a configuration that corresponds to the layout of DUT terminals 418. Of course, designing a probe card assembly 406 also can include other considerations, such as providing electrical paths through the probe card assembly 406 to electrically connect particular probes 414 to particular data channels from the tester.

Once the probe card assembly 406 is designed (2102), the probe card assembly can be manufactured and assembled (2104). Referring to the exemplary probe card assembly 406 shown in FIG. 1, probes 414 can be attached to probe substrate, and probe substrate 414, mounting fixture 408, and planarizing mechanism 410 can be assembled. Once the probe card assembly 406 is assembled (2104), planarizing mechanism 408 can be utilized to planarize contact tips of probes 414, as generally discussed above. For example, as discussed above, planarizing mechanism 408 can correct mis-orientation of probes 414 caused by irregularities and imperfections in elements of the probe card assembly 406. Non-limiting examples include irregularities and imperfections in probe substrate 412, probes 414, and/or the mechanism that attaches probe substrate 412 to mounting fixture 408. As will be discussed with respect to the multi-probe substrate probe card assembly 406' illustrated in FIG. 27, one planarizing mechanism 410' can correct mis-orientation of one set of probes 414' on one probe substrate 412' and another planarizing mechanism 410" can independently correct mis-orientation of another set of probes 414" on another probe substrate 412". Planarizing mechanisms 410', 410" can also orient each set of probes 414', 414" such that the array 2702 formed by probes 414', 414" is oriented as desired (e.g., in a plane or an approximate plane).

At 2108, a product that can include the probe card assembly 406 can be shipped to a test site for installation in a test system such as test system 401 of FIG. 1 or test system 101 of FIG. 6. At the test site, the product can be installed in a housing like housing 422 of FIG. 1 or a prober like prober 122 of FIG. 6 (2110). The product shipped can be just the probe card assembly 406, the probe card assembly 406 coupled with an adjustment mechanism 404, a probe card assembly 406 coupled with an adjustment mechanism 404 and a reference structure 402, or any combination of the foregoing.

The exemplary probe card 406 and docking and adjustment assembly comprising bridge 1302 and actuators 1312 is an example of the later. That is, the exemplary probe card 406 and docking and adjustment assembly comprising bridge 1302 and actuators 1312 shown in FIG. 14 can be assembled into a single product, which is then shipped at 2108 to a test site, where it can be installed at 2110 as a single product onto the insert ring 110 of a prober 122 as shown in FIGS. 6 and 14.

The exemplary probe card 406 and docking and adjustment assembly comprising bridge 1802 and actuators 1704 illustrated in FIG. 19 is an example in which the product shipped at 2108 can include both a probe card assembly 406 and an adjustment mechanism 408. That is, before shipping at 2108, actuators 1704 can be attached to the mounting fixture 408 of probe card assembly 406 and a product comprising probe card assembly 406 with attached actuators 1704 can be shipped to a test site at 2108. The test site can include a prober 122 with a head plate 1502 to which bridge 1802 was previously attached as shown in FIG. 19. At the test site, probe card assembly 406, which can include actuators 1704, can be installed in prober 122 at 2110 by placing the probe card 406 with attached actuators 1704 in insert ring 1512 as shown in FIG. 19.

The probe card assembly 406 of FIG. 20 illustrates an example in which just the probe card assembly 406 is shipped at 2108. That is, at 2108, the probe card assembly comprising mounting fixture 408, planarizing mechanism 410, and probe substrate 412 with probes 414 is shipped at 2108 to a test site that can include a prober 122 having head plate 1502 to which a bridge 2000 with actuators 2050 was previously attached as shown in FIG. 20. The probe card assembly 406 can then be installed in prober 122 at 2110 by placing the probe card assembly 406 in insert ring 1512 as also shown in FIG. 20.

Once installed at 2110, the orientation of the probe card assembly 406 with respect to reference structure 402 can be adjusted as needed at 2112. As described above (e.g., with respect to FIGS. 4 and 5, among other figures) and as will be described below with respect to FIGS. 28-30, adjustment mechanism 404 can correct mis-orientations of probes 414, 414', 414" and probe array 2702 caused by imperfections and irregularities in the testing apparatus.

Once the probe card assembly 406 is installed in prober 122 at 2110 and adjusted at 2112, the test system 101, 401 tests DUT 120 at 2114. A new probe card assembly design for testing a new DUT with a different arrangement of terminals may be implemented by simply designing a new probe substrate with new probes disposed to correspond to the layout of the terminals of the new DUT and then replacing the original probe substrate 412 of probe card assembly 406 with the new probe substrate.

Figure 23:
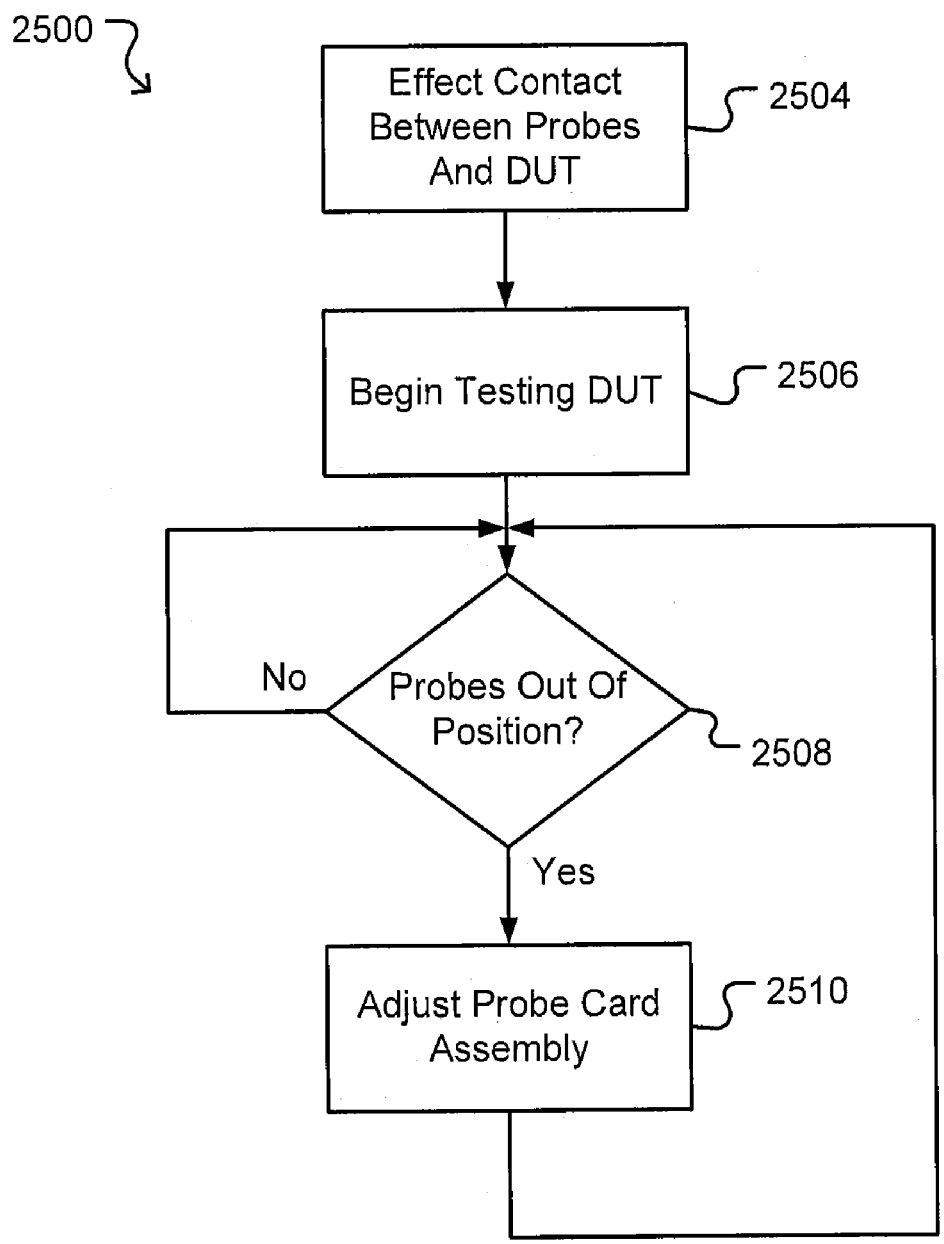
FIG. 23 illustrates an exemplary process for performing the step of testing a DUT from the process of FIG. 22.

FIG. 23 illustrates an exemplary process 2500 for testing DUT at 2114 of FIG. 22 in which docking and adjustment assembly 400 can be utilized during testing of DUT. A shown in FIG. 23, process 2500 begins with effecting contact between probes 414 and DUT terminals 418 (2504). As discussed above, DUT terminals 418 can be brought into contact with probes 414 by moving chuck 124 and holding probe card assembly 406 stationary. Alternatively, however, adjustment mechanism 404 can move probe card assembly 406 into contact with DUT 420, which need not move. As yet another alternative, both DUT 420 and probes 414 can be moved to effect contact (2504).

At 2506, testing of DUT 420 is started. During testing, the positions of probes 414 with respect to DUT terminals 418 are monitored (2508), which can be accomplished by sensing positions of DUT 420 (and/or DUT terminals 418) with respect to probe card assembly 406 (and/or probes 414). Positions of DUT 420 (and/or terminals 418) and probe card assembly 406 (and/or probes 414) can be determined in any suitable manner including through the use of capacitive sensor or optical sensor (e.g., one or more cameras). Alternatively, force or strain sensors can be used to detect mechanical shifts. If it is determined at 2508 that the probes 414 are out of position with respect to DUT terminals 418 (2508—yes), the orientation of probe card assembly 406 can be adjusted at 2510 using adjustment mechanism 404. For example, signals output by capacitive or optical sensors or force or strain gauges can be used to drive adjustment mechanism 404. Alternatively or in addition, the position of chuck 424 can be changed. The monitoring (2508) and adjusting (2510) can continue to be executed throughout testing of the DUT 420. As another alternative, adjusting (2510) can be executed between testing of different DUTs. For example, after testing a first DUT 420 or set of DUTs, the positions of probes 414 can be checked and adjusted as needed as discussed above with respect to 2510. Thereafter, a second DUT or set of DUTs can be tested. Of course, provisions can be made in the process 2500 of FIG. 22 to terminate the process, handle errors, etc.

The process of FIG. 23 can be implemented in hardware and/or software (as used herein the term software includes without limitation any form of software, firmware, microcode, etc., or any combination of the foregoing) or any combination thereof. For example, the system 2400 shown in FIG. 24 can be configured to execute process 2500 of FIG. 23. Processor 2402 can be any digital controller, computer, or computing device and can be configured to operate under control of software stored in memory 2408. (Memory 2408 can be any memory device including without limitation semiconductor, magnetic, or optical based memory devices, and memory 2408 can be volatile or non-volatile memory.) Processor 2402 can execute s 2504 and 2510 of process 2500 by sending control data to actuators 2406 that compose adjustment mechanism 404. Processor 2402 can receive data regarding the relative positions of probes 414 and DUT terminals 418 through sensor 2404 (which can be, without limitation, one or more optical sensors, capacitive sensors, strain gauges, force gauges, etc.).

Figure 25:
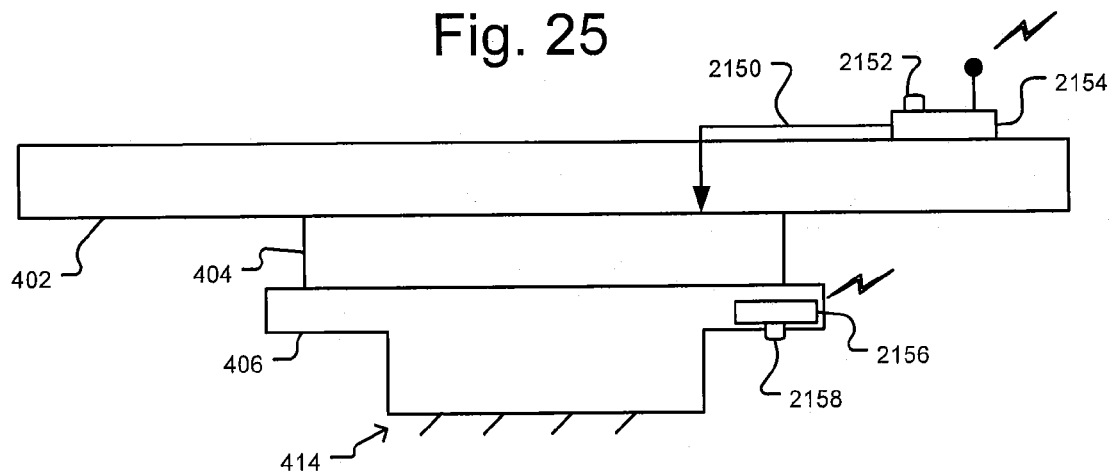
FIG. 25 illustrates an exemplary embodiment of a probe card assembly that can include wireless transmission of data relating to probe card assembly according to some embodiments of the invention.

FIG. 25 illustrates yet another exemplary embodiment. As shown, probe card assembly 406 can include a memory circuit 2156 having an embedded transmitter (not shown) for storing data regarding probe card assembly 406 and wirelessly transmitting (e.g., using radio frequency transmission techniques, infrared transmission techniques, etc.) the data to a controller 2154. For example, memory 2156 can store data representing predetermined settings for adjustment mechanism 404. That is, memory 2156 can store settings for adjustment mechanism 404 that have previously been determined will orient probe card assembly 406 to render probes 414 co-planar with DUT terminals 418. A button 2158 or other trigger device can cause memory 2156 to transmit the settings data.

Controller 2154, which can include an embedded receiver (not shown), receives the settings data transmitted by memory 2156 and provides control signals 2150 to adjustment mechanism 404, causing adjustment mechanism 404 to orient probe card assembly 406 in accordance with the settings data transmitted by memory 2156. Controller 2154 can also be configured to transmit settings data to memory 2156 for storage, and such transmission can be triggered by button 2152. For example, a probe card assembly 406 can be mounted in prober 122 and oriented using adjustment mechanism 404 such that probes 414 are co-planar with DUT terminals 418. Button 2152 can then be activated, causing controller 2154 to transmit settings data for adjustment mechanism 404 to memory 2156, where the settings data is stored. Memory 2156 and/or controller 2154 can alternatively or additionally be configured to transmit data to or receive data from any other nearby device, machine, or apparatus. For example, memory 2156 can transmit data regarding the probe card assembly 406 to tester 102 (see FIG. 6).

Controller 2154 and memory 2156 can be implemented using any suitable electronics including without limitation analog circuits, digital logic circuits, a processor operating under control of software, or any combination of the foregoing.

Figure 26:
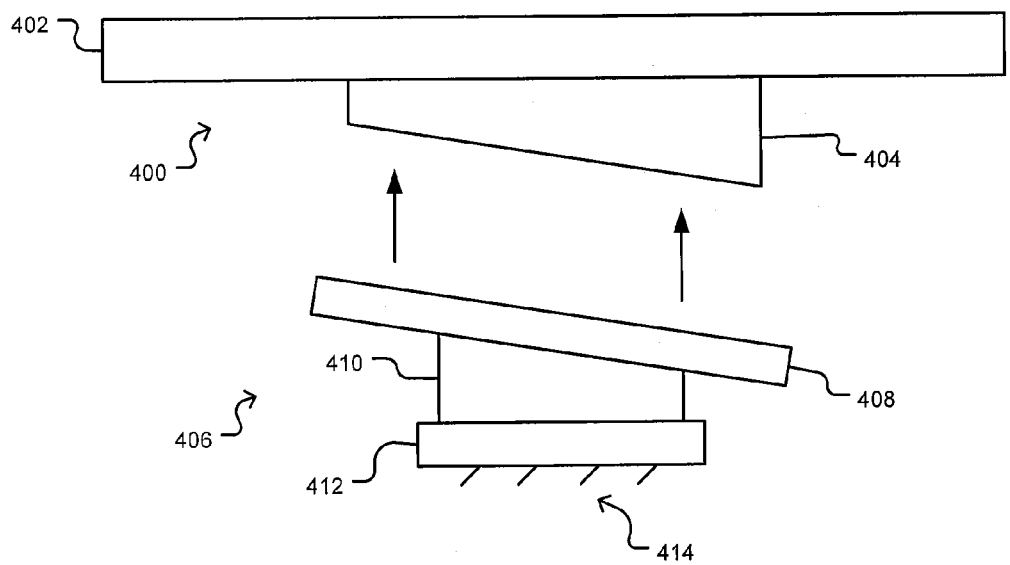
FIG. 26 illustrates use of a docking and adjustment assembly as a key that prevents the use of unauthorized probe card assemblies according to some embodiments of the invention.

FIG. 26 illustrates the use of a docking and adjustment assembly 400 as a key that allows only similarly keyed probe card assemblies to be docked. As shown in FIG. 26, adjustment mechanism 404 is intentionally set to provide non-planar docking of the probe card assembly 406. As also shown, planarizing mechanism 410 of probe card assembly 406 is intentionally set with a matching non-planarity. While the probe card assembly 406 is docked to reference structure 402, the non-planarities intentionally set by adjustment mechanism 404 and the planarizing mechanism 410 cancel so that probes 414 are planar. Only probe card assemblies 406 set with a matching nonplanarity, however, will dock with reference structure 402 to provide planarized probes 414. The non-planar setting of adjustment mechanism 404 thus acts as a key, allowing only probe card assemblies 406 set with a matching nonplanarity to be used with the docking and adjustment assembly 400.

FIG. 27 illustrates an exemplary probe card assembly 406' according to some embodiments of the invention that can be used in place of probe card assembly 406 in any of the embodiments described herein. As shown, probe card assembly 406', like probe card assembly 406, includes a mounting fixture 408. Probe card assembly 406', however, includes a plurality of probe substrates 412', 412" comprising probes 414', 414", which together form a larger array of probes 2702.

Each of probe substrates 412', 412" and probes 414', 414" may be generally similar to probe substrate 412 and probes 414. Probe card assembly 406' also includes a plurality of planarizing mechanisms 410', 410", each of which may be generally similar to planarizing mechanism 410. Although two probe substrates 414', 414" are shown, more may be used. Similarly, more than two planarizing mechanisms 410', 410" may be used. An example of a probe card assembly comprising a plurality of probe substrates is disclosed in the aforementioned U.S. patent application Ser. No. 11/165,833.

Figure 28:
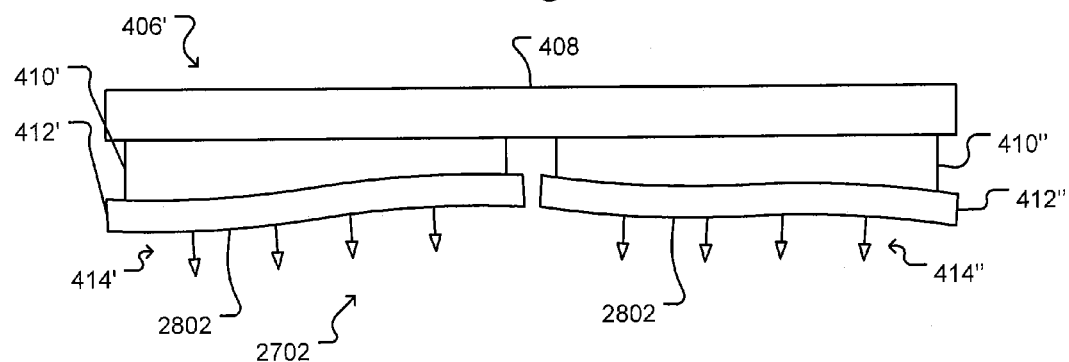
FIGS. 28-30 illustrate exemplary sources and correction of mis-orientation of probes.
Figure 29:
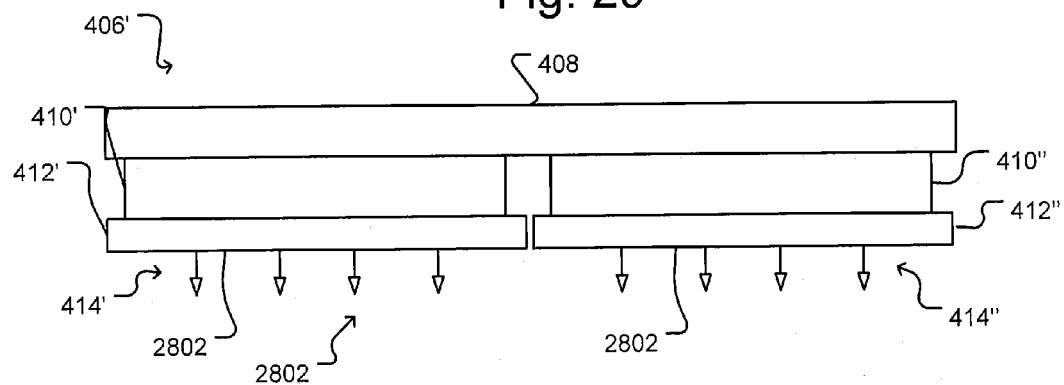
Figure 30:
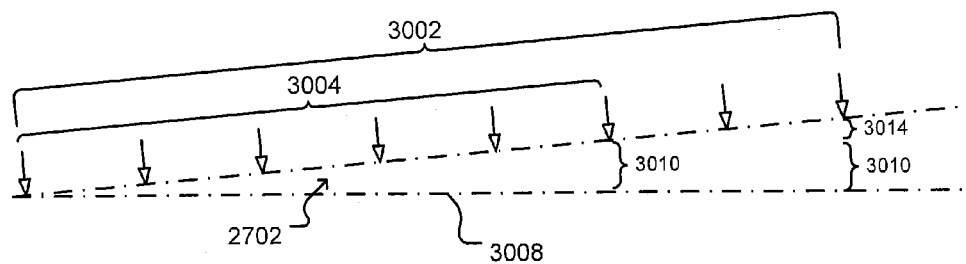

Thus, by using multiple probe substrates (e.g., 412', 412") as shown in FIG. 27, a relatively large array of probes can be created from smaller sets of probes (e.g., 414', 414"). The larger the array of probes, however, the more difficult it can be to orient probes such that their tips lie in a desired orientation (e.g., a plane or an approximate plane). FIGS. 28-30 illustrate exemplary sources of mis-orientation of the probes of probe array 2702 and the use of various embodiments disclosed herein to correct such mis-orientation.

FIG. 28 shows the probe card assembly 406' of FIG. 27 after manufacture of the probe card assembly 406'. As shown, tips of probes 414' and 414", which form probe array 2702, do not lie in a desired orientation (e.g., a plane or an approximate plane). Several factors can contribute to the irregular, undesired orientation of the probes of probe array 2702.

One such factor is irregularities in the surfaces 2802 of probe substrates 412', 412" to which probes 414', 414" are attached. For example, rather than being perfectly planar, surfaces 2802 may include imperfections such as curves or other irregularities. In fact, the larger the area of surface 2802, the more likely surface 2802 will contain more than negligible imperfections and irregularities. For example, assuming a desired orientation of the probes of array 2702 is an orientation in which the probe tips lie in a plane or an approximate plane, irregularities in surfaces 2802 of probe substrates 414', 414" may introduce non-planarities into the orientation of the probe array 2702.

Another source of irregularities in the orientation of the probes of probe array 2702 is the probes themselves. For example, ones of the probes of array 2702 may be slightly smaller or larger than others of the probes. As one such example, ones of the probes of array 2702 may extend from surfaces 2802 by a length that is more or less than others of the probes. Again assuming for the sake of example that the desired orientation of the tips of probes in array 2702 is a plane, slight irregularities in the size of the probes may introduce non-planarities into the orientation of the probe array 2702.

Yet another source of irregularities in the orientation of the probes of array 2702 can arise from the mechanism that attaches probe substrates 412', 412" to mounting fixture 408. The attachment mechanism (which is planarizing mechanisms 410', 410" in FIG. 28) may cause a slight tilt of probe substrates 412', 412" with respect to mounting fixture 408. The attachment mechanism can also exert slightly uneven forces on probe substrates 412', 412", which may introduce irregularities into surfaces 2802 of probe substrates 412', 412".

As discussed above, planarizing mechanisms 410', 410" are configured to correct irregularities in the orientation of the probes of probe array 2702 and move the tips of the probes into a desired orientation (e.g., a plane or an approximate plane or corresponding to a surface defined by the DUT terminals to be contacted by the probes) with respect to mounting fixture 408. Utilizing planarizing mechanisms 410', 410" as discussed above, each probe substrate 412', 412" can be manipulated to place probes 414' and probes 414" into desired orientations, which in turn creates a desired orientation of the probe array 2702 formed by probes 414', 414". Assuming that a desired orientation of the tips of the probes of array 2702 is planar, planarizing mechanisms 410', 410" can put the tips of the probes of array 2702 into a planar orientation with respect to mounting fixture 408, as shown in FIG. 29. In fact, where planarizing mechanisms 410', 410" comprise differential screw assemblies, tips of probes in an array (e.g., like 2702) measuring about 191 millimeters by 191 millimeters have been planarized with respect to a reference structure (e.g., mounting fixture 408) on a probe card assembly (e.g., 406') to within about 11 microns. (That is, as a first of the probes contacts a plane, all of the other probes are no further than 11 microns from the plane.) The foregoing numerical example is exemplary only and not limiting. For example, in some cases, more or less planarity of the probes will be achieved using differential screw assemblies as actuators. In addition, one may be able to achieve more or less planarity of the probes using other types of actuators, such as pneumatically operated actuators. The size of the probe array can also affect the degree of planarity achieved. Also, different test scenarios may require more or less planarity of the probe array.

No matter how perfectly or near perfectly the probes of probe array 2702 are oriented with respect to mounting fixture 408, however, additional mis-orientations of the probe array 2702 with respect to DUT terminals (not shown) are can be introduced by the testing apparatus (e.g., test system 401 of FIG. 1 or 101 of FIG. 6) while the probe card assembly 406' is mounted in the testing apparatus. For example, the structure in the testing apparatus to which the probe card assembly 406' is attached may have structural imperfections that cause a tilt of the probe card assembly 406' with respect to the testing apparatus. As another example, the mechanism (e.g., stage 430, 130) that holds the DUT to be contacted by the probe card assembly 406' may be askew, which causes a mis-orientation of the probes of the probe card assembly 406' with respect to the DUT terminals (not shown).

Whatever the cause of the mis-orientation of the probes of array 2702 with respect to the DUT terminals (not shown), the greater the size of the probe array 2702, the greater the detrimental effect of any skew or other mis-orientation of the probe array 2702 with respect to the DUT terminals (not shown). FIG. 30—which shows probe array 2702 as planarized in FIG. 29 (for ease of illustration reference structure 408, planarizing mechanisms 410', 410", and probe substrates 412', 412" are not shown) but askew with respect to a surface 3008 corresponding to DUT terminals (not shown)—illustrates how the effect of a planarizing error introduced by the testing apparatus increases with the size of the probe array 2702. As shown, the amount of a planarizing error for a smaller array identified by reference numeral 3004 in FIG. 30 is distance 3010. For a larger array identified by reference numeral 3002 in FIG. 30, however, the same skew of probe array 2702 with respect to the surface 3008 defined by DUT terminals (not shown) gives rise to a greater planarizing error identified in FIG. 30 as distance 3010 plus an additional distance 3014.

Thus, in the example shown in FIG. 30, the probes of probe array 2702, which were precisely adjusted to lie in a plane (or an approximate plane) as shown in FIG. 29, are askew with respect to a surface 3008 corresponding to the DUT terminals (not shown) while mounted in a testing apparatus, which gives rise to a planarizing error whose magnitude increases with the size of the probe array 2702. Referring to the example discussed above with respect to FIG. 29, a probe array 2702 planarized with respect to mounting structure 408 to within about 18 microns can be out of orientation with a surface 3008 defined by DUT terminals (not shown) by two, three, four, five, or more times that amount while the probe card assembly 406' is mounted in the testing apparatus (not shown). Adjustment mechanism 404 (see FIGS. 1, 4, and 5, among other figures), is able to reduce most if not all of such planarizing errors caused by skew introduced by the testing apparatus and bring the orientation of probe array 2702 back to the precision shown in FIG. 29 (e.g., about 18 microns in some cases) to a desired tolerance.

Thus, although the invention is not so limited, the ability to adjust the orientation of probe array 2702 with respect to a reference structure (e.g., mounting fixture 408 in FIG. 29) on the probe card assembly 406' to correct for mis-orientations of probe array 2702 caused by irregularities in probe substrates 412' and 412", probes 414' and 414", and/or mechanisms that attach probe substrates 412' and 412" to mounting fixture 408 as shown in FIG. 29, and then further adjust an orientation of the probe card assembly 406' with respect to the probe card assembly (not shown) after the probe card assembly 406' is mounted in the probe card assembly (not shown) to correct mis-orientations caused by irregularities in the probe card assembly, allows the probe array 2702 to be precisely oriented with respect to the DUT terminals (not shown) contacted by the probe array 2702 and reduces skew errors, which as shown in FIG. 30, are particularly pronounced for large probe arrays.

Reducing the mis-orientation of the probes with respect to the DUT terminals can provide additional advantages. For example, reducing mis-orientation of probes with respect to DUT terminals can increase the uniformity and repeatability of scrub marks made by the probes on the DUT terminals and can decrease the size of the scrub marks. As is known in the field, the ability to repeatedly produce smaller, more uniform scrub marks on DUT terminals (e.g., bond pads of semiconductor dies) provides many advantages, such as, without limitation, facilitating the bonding of wires to the DUT terminals.

Each of the embodiments described herein can be configured such that a user can more quickly adjust an orientation of probe card assembly 406, 406' using adjustment mechanism 404 than the user can adjust an orientation of probe substrate (s) 412, 412', 412" using planarizing mechanism(s) 410, 410', 410". Thus, although planarizing mechanism(s) 410, 410', 410"—rather than adjustment mechanism 404—could be used to reduce mis—orientation of the probes 414, 414', 414" with respect to DUT terminals caused by irregularities in the mounting of the probe card assembly to the testing apparatus (as discussed above with respect to FIG. 30), a user will typically be able to reduce such mis-orientation more quickly using adjustment mechanism 404 to adjust the orientation of probe card assembly 406, 406'.

Although discussed for ease of description and illustration with respect to the probe card assembly 406' having two probe substrates 412', 412", the foregoing advantages are equally applicable to probe card assembly 406, which is illustrated as having one probe substrate 412 but, as discussed above, may have more than one substrate 412, or to a probe card assembly that has three or more probe substrates.

Figure 31:
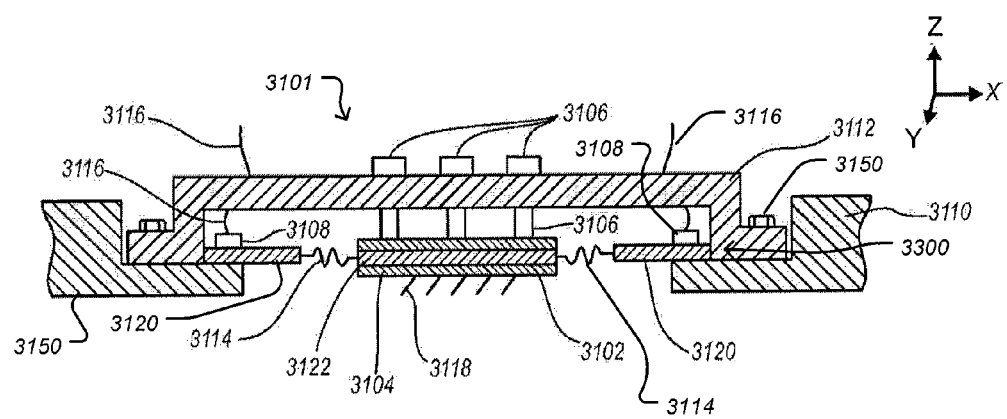
FIG. 31 illustrates an exemplary probe card assembly for testing one or more DUTs according to some embodiments of the invention.

FIG. 31 illustrates an exemplary probe card assembly 3101 for testing one or more DUTs (e.g., like DUT 420 of FIG. 1) (not shown) in which a second portion 3122 of a wiring substrate 3300 is mechanically decoupled, at least in part, from a first portion 3120 of the wiring substrate 3300 according to some embodiments of the invention. As shown, the probe card assembly 3101 can include a mounting structure 3112, which can be attached to an insert ring 3110. Insert ring 3110 can be part of a prober (e.g., like prober 122 of FIG. 6)

(not shown) and can thus be like insert ring 110 of FIG. 6). Alternatively, insert ring 3110 can be part of a more general housing (not shown) in which the DUT (not shown) is disposed. For example, insert ring 3110 can be part of a housing, like housing 422 of FIG. 1. Bolts 3150 can attach the mounting structure 3112 to the insert ring 3110, or alternatively, the mounting structure 3112 can be attached by other means (e.g., screws, clamps, etc.) to the insert ring 3110. As shown in FIG. 31, the mounting structure 3112 can comprise a bridge structure, which can be rigid (e.g., the mounting structure can comprise a metal). For example, the mounting structure 2112 can be like the bridge structure 1302 shown in FIGS. 13 and 14.

As shown, the probe card assembly 3101 can also include a wiring substrate 3300 (e.g., a wiring board, such as a printed circuit board), which can have two general portions: a first portion 3120 and a second portion 3122. The first portion 3120 can comprise a substantially rigid substrate (e.g., a printed circuit board), and the second portion 3122 can also comprise a substantially rigid substrate (e.g., a printed circuit board). Although not shown, the first portion 3120 of the wiring substrate 3300 can extend under or behind the mounting structure 3112. One or more electrical connectors 3108 can be disposed on the first portion 3120 of the wiring substrate 3300. The electrical connectors 3108 can receive electrical connections 3116 from a tester (e.g., like tester 102 of FIG. 6). Electrical connections 3116 can thus be like electrical connectors 108 of FIG. 6. The first portion 3120 of the wiring substrate 3300 can include electrical wiring (not shown) that provides a plurality of electrical paths between the connectors 3108 and one or more flexile electrical connections 3114 between the first portion 3120 of the wiring substrate 3300 and the second portion 3122 of the wiring substrate 3300. As also shown, the second portion 3122 of the wiring substrate 3300 can be part of a probe head assembly 3102, which can include electrically conductive probes 3118 configured to make electrical connections with terminals of a DUT (not shown). The second portion 3122 of the wiring substrate 3300 by itself or with other elements of the probe head assembly 3102 can also include electrical wiring (not shown) that provides electrical paths from the flexible electrical connections 3114 to the probes 3118. The first portion 3120 of the wiring substrate 3300, the flexible electrical connections 3114, and the second portion 3122 of the wiring substrate 3300 (and possibly other elements of the probe head assembly 3102) can thus provide a plurality of electrical paths between the connectors 3108 and the probes 3118.

The flexible electrical connections 3114 can be any means for providing electrical connections that is flexible or compliant. Non-limiting examples include flexible wires, flex circuits, etc. The wiring (not shown) in the first portion 3120 of the wiring substrate 3300 and the second portion 3122 of the wiring substrate 3300 can comprise electrically conductive traces and/or vias in, on, and/or through the first portion 3120 and second portion 3122 of the wiring substrate 3300. Similar or different wiring (not shown) can be provided as needed through other parts of the probe head assembly 3102 from the second portion 3122 of the wiring substrate 3300 to the probes 3118. The probes 3118 can be like probes 414 of FIG. 1, and the probe head assembly 3102 can be generally like the probe substrate 412 of FIG. 1 and can thus be configured like any of the examples of the probe substrate 412 disclosed, described, or mentioned herein including, without limitation, probe substrate 756, and can further comprise a plurality of probe substrates, such as probe substrates 412', 412" shown in FIG. 27.

As shown in FIG. 31, the probe card assembly 3101 can also include one or more actuators 3106 (three are shown but more or fewer can be used), which can be configured to move the probe head assembly 3102 with respect to the mounting structure 3112. The actuators 3106 can also be a means by which the probe head assembly 3102 is attached to the mounting structure 3112. For example, ends of the actuators 3106 can thread into attachments (e.g., threaded studs) attached to the probe head assembly 3102. Alternatively or in addition, brackets, clamps, or other attaching mechanisms (not shown) can be used to attach the probe head assembly 3102 to the mounting structure 3112. A spring mechanism (not shown) can be utilized with such brackets, clamps, or other attaching mechanisms (not shown) to bias the probe head assembly 3102 toward the mounting structure 3112, and the actuators 3106 can be configured to apply a force to a portion of the probe head assembly 3102 in opposition to the biasing of the spring mechanism (not shown). Alternatively or in addition, one or more of the actuators 3106 can be configured to selectively apply a pushing force to a portion of the probe head assembly 3102 pushing that portion of the probe had assembly 3102 away from the mounting structure 3112 or a pulling force on the portion of the probe head assembly 3102 pulling that portion of the probe had assembly 3102 toward the mounting structure 3112. The actuators 3106 can thus be configured to apply a plurality of selectively changeable forces to the probe head assembly 3102 in the same way as the actuators 702 can be configured to apply forces 1102 to the probe substrate 712 as shown in FIGS. 9-12. The actuators 3106 can thus be configured to translate the probe head assembly 3102 in the "z" direction and rotate the probe head assembly 3102 about the "x" and "y" axes, and if the actuators 3106 are configured to apply controllable pulling and pushing forces to the probe head assembly 3102 (e.g., as shown in FIG. 12), the actuators 3106 can alter a shape of the probe head assembly 3102. Actuators 3106 can be like any of the exemplary actuators described herein, including without limitation actuators 702 of FIGS. 9 and 10.

The second portion 3122 of the wiring substrate 3300 can be movable with respect to the first portion 3120. For example, the second portion 3122 and the first portion 3122 of the wiring substrate 3300 can be mechanically decoupled but electrically connected by flexible electrical connections 3114. That is, the flexible nature of flexible electrical connections 3114 can allow the second portion 3122 of wiring substrate 3300 to move with respect to the first portion 3120. This can allow the probe head assembly 3102 to move without constraints or with reduced constraints imposed by the first portion 3120 of the wiring substrate 3300. Indeed, the mechanical decoupling of the first portion 3120 and the second portion 3122 of the wiring substrate 3300 can allow the probe head assembly 3102 to move without constraints or with reduced constrains imposed by the test system (e.g., test system 101 of FIG. 6 or housing 422 of FIG. 1) in which the probe card assembly 3101 is used. For example, mechanical constraints on the probe head assembly 3102 from one or more of the following can be eliminated or reduced: electrical connectors 3108, attachment of the probe card assembly 3101 to the insert ring 3110, any external forces (not shown) on the mounting structure 3112, etc. This can, for example, eliminate or reduce mechanical resistance opposing movement by the actuators 3106 of the probe head assembly 3102—and thus the probes 3118—into a position where an electrical interface between the probes 3118 and DUT can be successfully achieved and maintained. For example, the actuators 3106 can be used to adjust an orientation of the tips of the probes 3118 to be generally the same as or at least similar to an orientation of terminals of the DUT (not shown), for example, as generally discussed above with respect to FIG. 1. Moreover, the actuators 3106 can be used to maintain contact between the probes 3118 and the terminals of the DUT (not shown) during testing of the DUT by, for example, using the actuators 3106 to move the probe head assembly 3102 during testing of the DUT to compensate for, for example, thermally induced movement, contraction, expansion, bowing, etc. of the DUT (not shown), the probes 3118, the probe head assembly 3102, etc.

Figure 32:
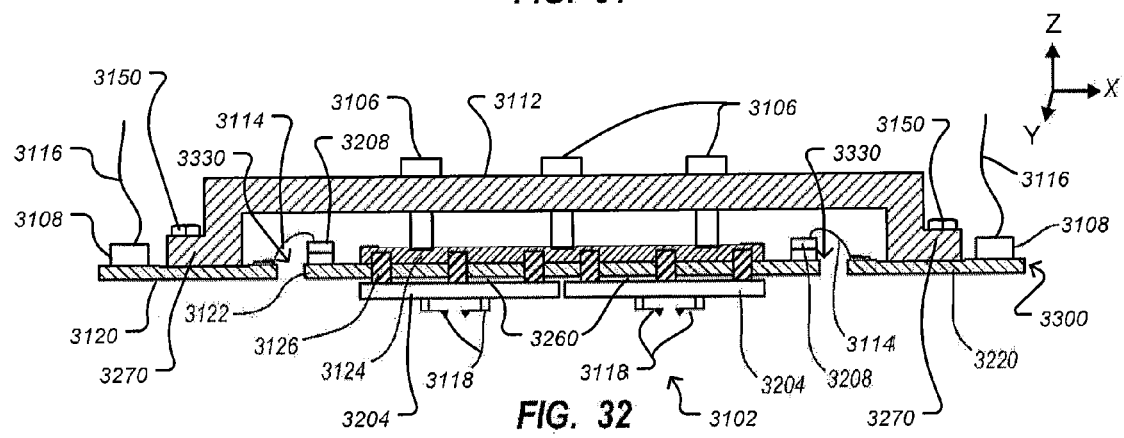
FIG. 32 illustrates an exemplary configuration of the probe card assembly of FIG. 31 according to some embodiments of the invention.
Figure 33:
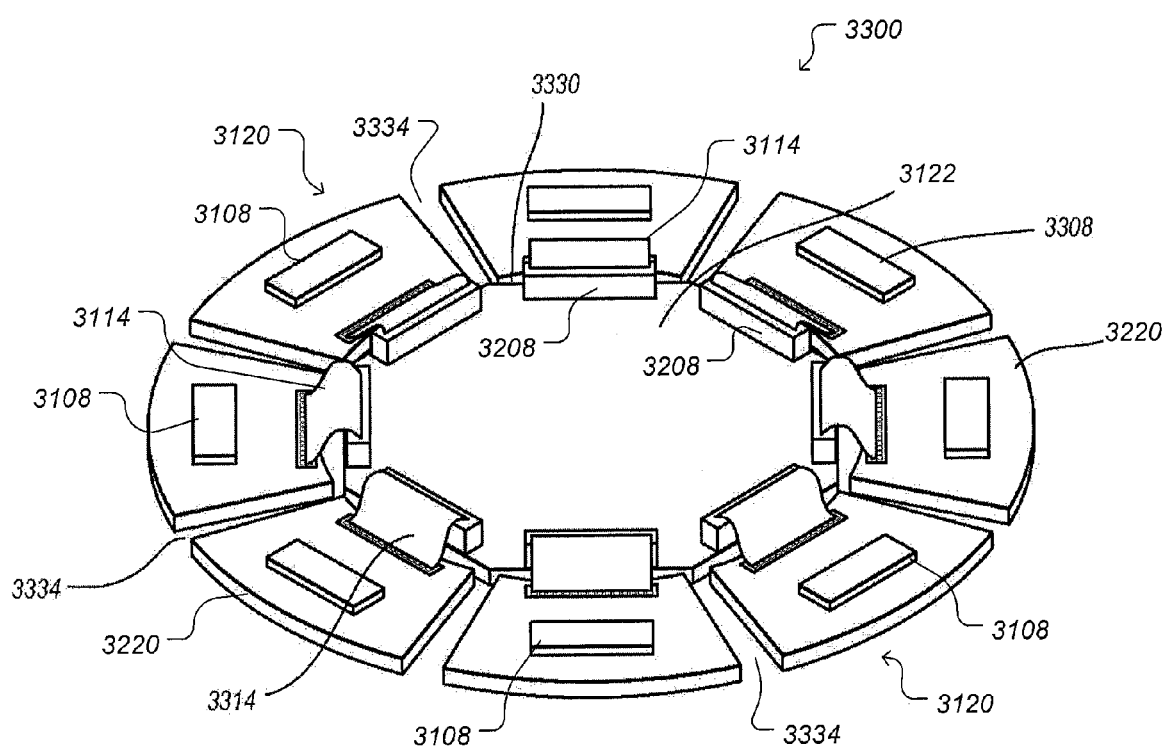
FIG. 33 illustrates the wiring substrate of the probe card assembly of FIG. 32 according to some embodiments of the invention.

FIGS. 32 and 33 illustrate an exemplary configuration of the probe card assembly 3101 of FIG. 31 according to some embodiments of the invention. FIG. 32 shows a side view of the probe card assembly, and FIG. 33 shows a perspective view of the wiring substrate 3300. As best seen in FIG. 33, the first portion 3120 of the wiring substrate 3300 can comprise a plurality of sections 3220, and there can be a gap 3334 between each section 3220. (In the example shown in FIG. 33, the first portion 3120 of the wiring substrate 3300 comprises eight sections 3220. In other configurations, however, the first portion 3120 of the wiring substrate 3300 can comprise more or fewer sections, including only one section.) Portions of the mounting structure 3112 (not shown in FIG. 33) can fit into the gaps 3334. For example, the mounting structure 3112 can comprise feet 3270 (see FIG. 32) through which bolts 3150 can pass, and the feet 3270 can be shaped to fit in the gaps 3334. As also shown in FIGS. 32 and 33, a space 3330 can be provided between each section 3220 and the second portion 3122 of the wiring substrate 3300, which as discussed above, can mechanically decouple the second portion 3122 of the wiring substrate 3300 from the first portion 3120 (which, as discussed, comprises the sections 3220).

The configuration of the first portion 3120 of the wiring substrate 3300 shown in FIG. 33 is exemplary only, and many other configurations are possible. For example, the first portion 3120 of the wiring substrate 3300 need not comprise sections 3220. As just one example, the sections 3220 can be replaced with an annular ring shaped substrate that occupies the space occupied by sections 3220 and gaps 3334 in FIG. 33.

Referring again to FIG. 32, the exemplary configuration of the probe head assembly 3102 shown in FIG. 32 can include a stiffener plate 3124, the second portion 3122 of wiring substrate 3300, and a plurality of probe heads 3204. Probes 3118 can be attached to each of the probe heads 3204, and probe-head-assembly actuators 3126 can be provided to adjust individually an orientation of each of the probe heads 3204 with respect to the stiffener plate 3124. The stiffener plate 3124 can be a rigid plate (e.g., a metal plate), and the actuators 3126 can be like any of the actuators or other mechanisms discussed herein as examples of the planarizing mechanism 410 in FIG. 1. As shown in FIGS. 32 and 33, the second portion 3122 of the wiring substrate 3300 can include pluggable connectors 3208, which can allow flexible electrical connections 3114 from the first portion 3120 (comprising sectors 3220) of the wiring substrate 3300 to be plugged into—and thus electrically connected to—the second portion 3122 of the wiring substrate 3300. The pluggable connectors 3208 can also allow the flexible electrical connections 3114 from the first portion 120 (comprising sectors 3220) of the wiring substrate 3300 to be unplugged from—and thus electrically disconnected from—the second portion 3122 of the wiring substrate 3300. The pluggable connectors 3208 shown in FIGS. 34 and 35 are exemplary only and can be replaced with any suitable mechanism for making electrical connections between the probe head assembly 3102 (which, as discussed above, includes the second portion 3122 of the wiring substrate 3300 and the first portion 3120 of the wiring substrate 3300.

Probe head assemblies can be readily interchanged in the exemplary configuration of the probe card assembly 3101 of FIG. 32. For example, the probe head assembly 3102 can be unplugged from pluggable connectors 3208 and mechanically detached from the actuators 3106. As mentioned above, the probe head assembly 3102 can include threaded studs (not shown) into which actuators 3106 thread. In such a case, mechanically detaching the probe head assembly 3102 from the actuators 3106 can comprise rotating the actuators 3106 to remove the actuators 3106 from the threaded studs (not shown). A new probe head assembly (e.g., that can be in some ways generally similar to probe head assembly 3102) can then be plugged into pluggable connectors 3208 and mechanically attached to the actuators 3106 and used to test DUTs (not shown). (Mechanically attaching the new probe head assembly to the actuators 3106 can comprise threading ends of the actuators 3106 into threaded studs (not shown) on the new probe head assembly.) This can be done while the mounting structure 3112 remains attached to the insert ring 110.

As discussed above, the electrical connections 3116 to connectors 3108 can be configured to make electrical connections with a tester (e.g., like tester 102 of FIG. 6). Each sector 3220 of the first portion 3120 of the wiring substrate 3300 can include wiring (e.g., electrically conductive traces and/or vias on, in, or through the sector 3220) (not shown) providing a plurality of electrical paths from a connector 3108 to a flexible electrical connection 3114, which in turn can provide a plurality of electrical paths to a pluggable connector 3208. Wiring (e.g., electrically conductive traces and/or vias) on, in, and/or through the second portion 3122 of the wiring substrate 3300) (not shown) can provide a plurality of electrical paths from the pluggable connectors 3208 to flexible electrical connectors 3260 between the second portion 3122 of the wiring substrate 3300 and the probe heads 3204. The flexible electrical connectors 3260 can be like flexible electrical connectors 754 of FIG. 9. Wiring (e.g., electrically conductive traces and/or vias) on, in, and/or through each probe head 3204 can provide electrical paths from a flexible electrical connector 3260 to ones of the probes 3118 on a probe head 3204.

Figure 34:
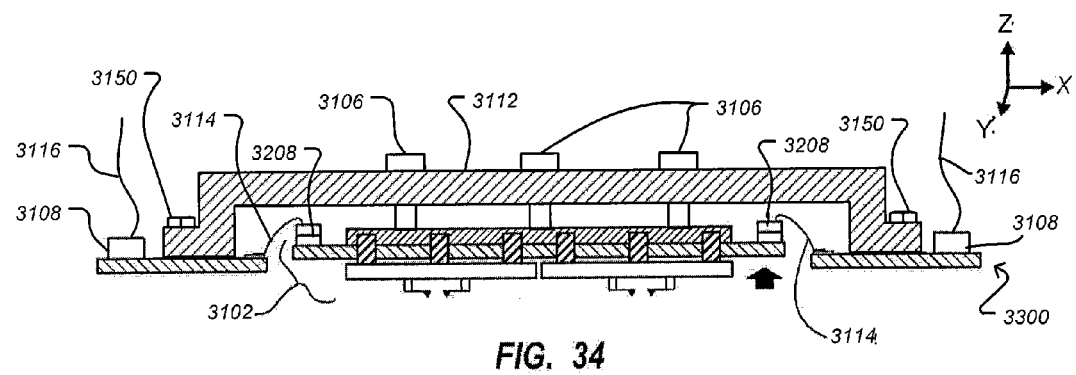
FIGS. 34-37 show exemplary translation and rotation of the probe head assembly of FIG. 32.
Figure 35:
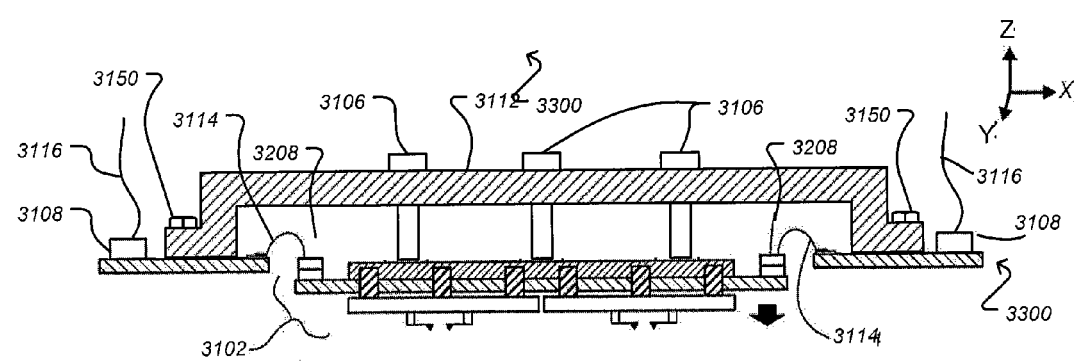

As shown in FIGS. 34 and 35, the actuators 3106 can be activated to translate the probe head assembly 3102 in the "z" direction with respect to the mounting structure 3112. In FIG. 34, actuators 3106 are activated to translate the probe head assembly 3102 along the "z" axis towards the mounting structure 3112. In FIG. 35, actuators 3106 are activated to translate the probe head assembly 3102 along the "z" axis away from the mounting structure 3112.

Figure 36:
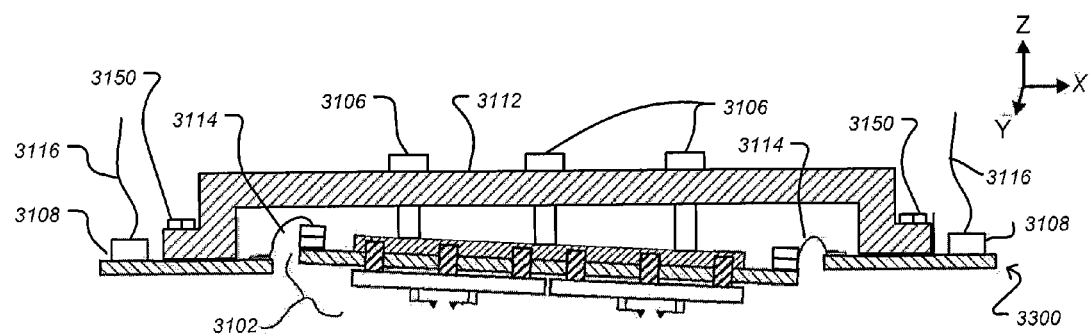
Figure 37:
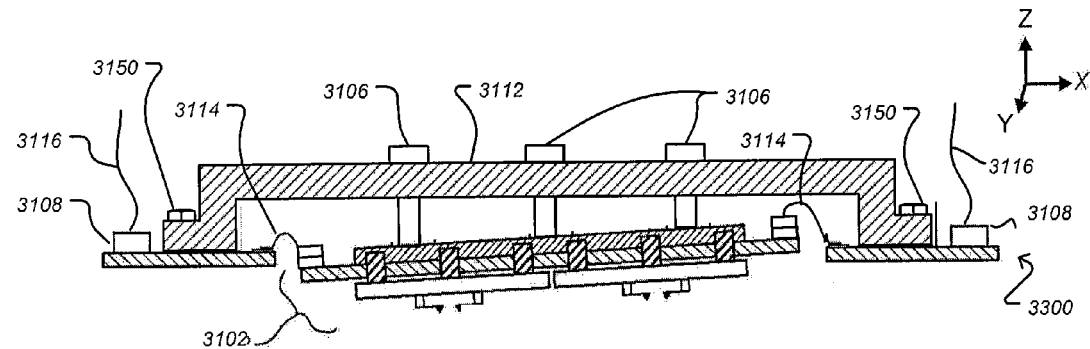

As shown in FIGS. 36 and 37, the actuators 3106 can be activated to rotate the probe head assembly 3102 about the "x" and/or "y" axes with respect to the mounting structure 3112. In FIG. 36, actuators 3106 are activated to tilt the probe head assembly 3102 in a first direction. In FIG. 37, actuators 3106 are activated to tilt the probe head assembly 3102 in a second direction. As can be seen in FIGS. 36 and 37, the probe head assembly 3106 can be tilted by extending some or all of the actuators 3106 to different lengths one from another.

Figure 38:
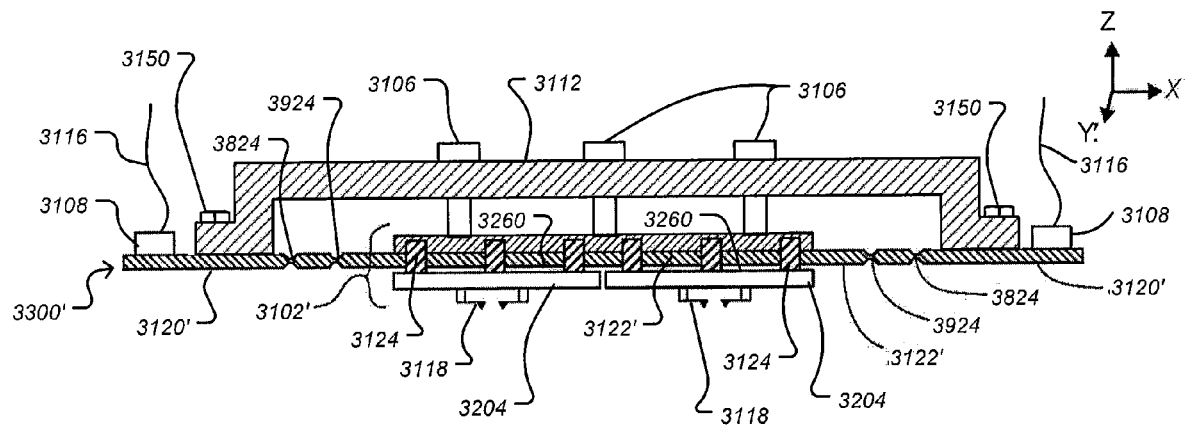
FIGS. 38 and 39 illustrate side views of a probe card assembly having a wiring substrate with notches between a first portion and a second portion of the wiring substrate.
Figure 39:
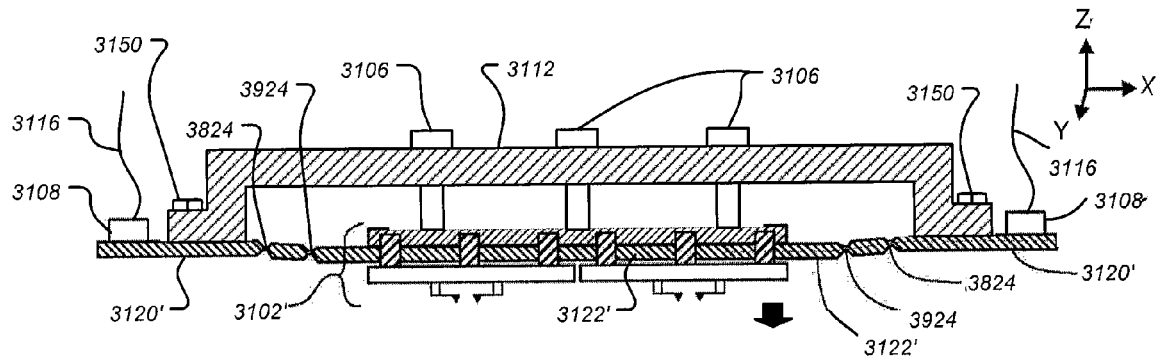
Figure 40:
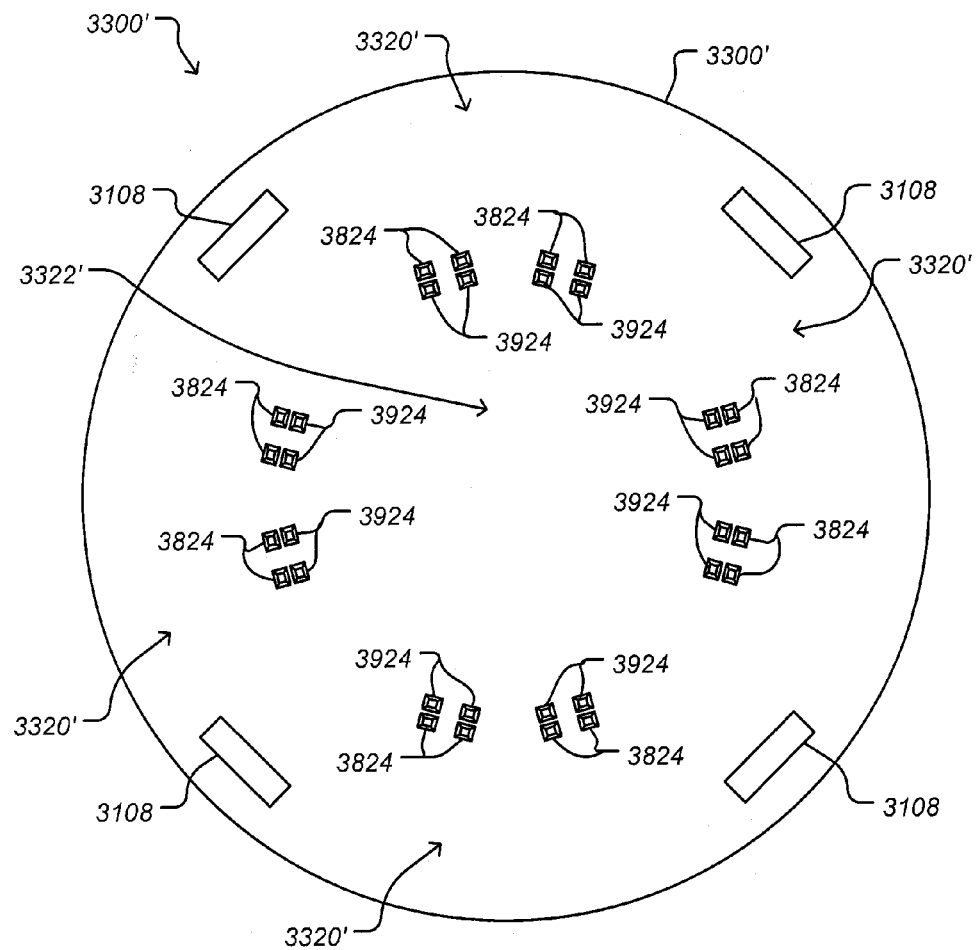
FIG. 40 illustrates a top view of the wiring substrate of FIGS. 38 and 39.

FIGS. 38-40 show an exemplary variation of the configurations of the probe card assembly 3101 shown in FIG. 31 and FIGS. 32-37 according to some embodiments of the invention. FIGS. 38 and 39 show side views of the probe card assembly 3101 (in FIG. 39, the probe head assembly 3102 is translated downward), and FIG. 40 shows a top view of only the wiring substrate 3300' of the probe card assembly 3101 of FIGS. 38 and 39.

In FIGS. 38-40, the wiring substrate 3300' lacks the spaces 3330 that separate the first portion 3120 of the wiring substrate 3300 from the second portion 3122 in FIGS. 31-37. Instead, the wiring substrate 3300' of FIGS. 38-40 can include notches 3824, 3924, which can divide a first portion 3120' of the wiring substrate 3300' from a second portion 3122' of the wiring substrate 3300' and provide flexibility and compliance that allows the second portion 3122' to move with respect to the first portion 3120'. In the example shown in FIG. 39, the probe head assembly 3102 is moved down (in the "z" direction) with respect to the mounting structure 3112. The actuators 3106 can thus be activated to perform the downward "z" translation movement of the probe head assembly 3102 illustrated in FIG. 39 (which can be similar to the exemplary movement shown in FIG. 35). The actuators 3106 can also be activated to translate the probe head assembly 3102 upward along the "z" axis, similar to the movement shown in FIG. 34, and the actuators 3106 can also be activated to rotate the probe head assembly 3102 about the "x" and/or the "y" axes, which can produce the tilting movements illustrated in FIGS. 36 and 37. The notches 3824, 3924 can provide flexibility and compliance that allows for such movement.

The notches 3824, 3924 can be cut, etched, grinded, or otherwise formed in the wiring substrate 3300'. Moreover, each notch 3824, 3924 can form an hour glass shape as shown in FIGS. 38 and 39, and two such notches 3824, 3924, such as shown in FIGS. 38 and 39, can form a double hour glass shape. Alternatively, notches 3824, 3924 can be formed in other shapes. In addition, notches 3824, 3924 can be in pairs as shown in FIGS. 38-40 or can be grouped in other numbers, including one. Many variations are possible. For example, notches 3824, 3924 can be replaced with holes, slots, or any other type of flexure feature that provides greater flexibility and/or compliance than other portions of the wiring substrate 3300' that lack such notches, holes, slots, or other types of flexures. Such notches, holes, slots, or other types of flexure features can be formed in the wiring substrate 3300' by machining, cutting, or etching the wiring substrate 3300' or by any other process suitable for forming notches, holes, slots, or other flexure features in a wiring substrate. The notches, holes, slots, or other types of flexure features can be formed in locations on the wiring substrate 3300' to define a second portion 3122' and allow the second portion 3122' to move with respect to the first portion 3120' of the wiring substrate 3300'. Wiring can be provided on, in, and/or through the wiring substrate 3300' in the form of electrically conductive traces and/or vias (not shown). Such wiring can provide electrical paths from the connectors 3108 to flexible connectors 3260 (which, as discussed above, can electrically connect the second portion 3122' of the wiring substrate 3300' with the probe substrates 3204 (see FIG. 38). Traces and/or vias (not shown) that form those paths can be disposed on or in the wiring substrate 3300' where notches 3824, 3924 are not located.

As an alternative to notches 3824, 3924, the wiring substrate 3300' can be sufficiently thin to allow flexible movement (e.g., deformation). If sufficiently thin to flex, wiring substrate 3300' need not include notches 3824, 3924 for there to be movement between what is labeled the first portion 3120' and the second portion 3122' in FIGS. 38 and 39. For example, the flexibility of the wiring substrate 3300' can allow for the movement of the second portion 3122' with respect to the first portion 3120' as shown in FIGS. 38 and 39 and described above without notches 3824, 3924.

Figure 41:
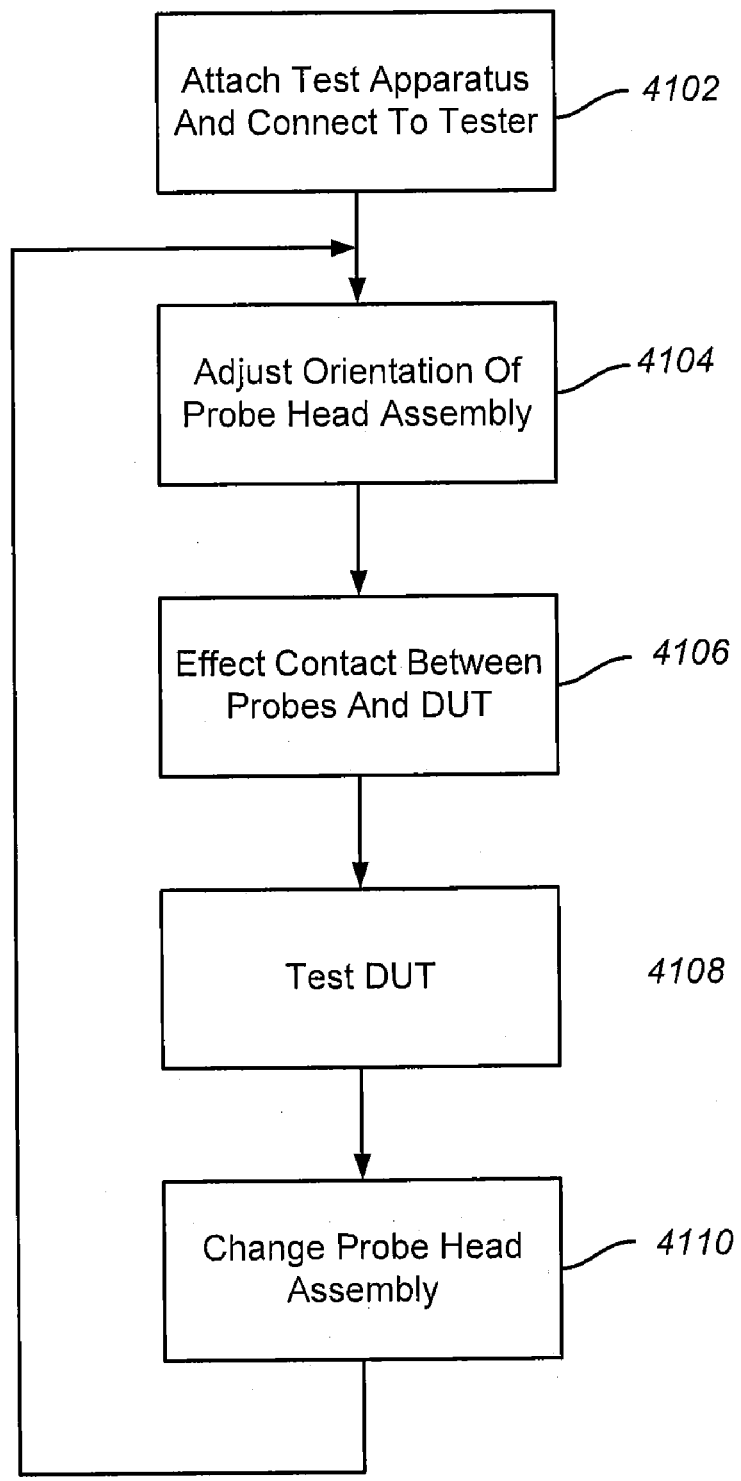
FIG. 41 illustrates an exemplary process for testing one or more DUTs according to some embodiments of the invention.

FIG. 41 illustrates an exemplary process for testing one or more DUTs according to some embodiments of the invention. Although the invention is not so limited, for ease of illustration and discussion, the process of FIG. 41 is discussed herein with regard to an example in which the probe card assembly 3101 of FIG. 31 is configured as shown in FIG. 32 and is used in the test system 101 of FIG. 6 (in place of 400 and 406 in FIG. 6). The mounting structure 3112 and the actuators 3106 of FIG. 32 can replace 400 in FIG. 6, and the first portion 3120 of the wiring substrate 3300 and the probe head assembly 3102 (which includes the second portion 3122 of the wiring substrate 3300) of FIG. 32 can replace 406 in FIG. 6.

Referring now to FIGS. 6, 31, 32, and 41, at 4102 of FIG. 41, the probe card assembly 3101 can be attached to the insert ring 110 of FIG. 6 in the same way that probe card assembly 3101 is attached to the insert ring 3110 in FIG. 31 (e.g., with bolts 3150), and electrically connected to the tester 102 through connectors 108 of FIG. 6. (As discussed above, the electrical connections 3116 in FIGS. 31 and 32 can be like connectors 108 of FIG. 6.)

At 4104 of FIG. 41, the orientation of the probe head assembly 3102 can be adjusted. For example, the orientation of probe head assembly 3102 can be adjusted so that tips of the probes 3118 match or approximate an orientation of terminals 118 of the DUT 120 (see FIG. 6). This can be accomplished by activating the actuators 3106 as generally discussed above. The probe head assembly actuators 3126 (see FIG. 32) can also be used to adjust the orientation of the probe head assembly 3102.

At 4106 of FIG. 41, contact between the probes 3118 and terminals 118 of the DUT 120 (see FIG. 6) can be effected. This can be accomplished by moving the chuck 124 generally along the "x" and/or "y" axes to align ones of the terminals 118 of the DUT 120 (FIG. 6) with ones of the probes 3118. The chuck 124 can then be moved generally along the "z" axis toward the probes 3118 until the terminals 118 are brought into contact with the probes 3118. Rather than or in addition to moving the chuck 124 in the "z" direction, actuators 3106 can be activated to move the probe head assembly 3102 in the "z" direction towards the DUT 120 until the probes 3118 are brought into contact with the terminals 118.

Once contact is made at 4106, the DUT 120 can be tested at 4008 of FIG. 41. For example, the tester 102 can generate test signals that are provided through the system 101 to ones of the probes 3118 and to the DUT 120. Response signals generated by the DUT 120 in response to the test signals can be provided in similar fashion through ones of the probes 3118 back to the tester 102. The tester 102 can then analyze the response signals to determine whether the DUT 120 passed the testing. During testing at 4106, the actuators 3106 can be activated to adjust a position of the probe head assembly 3102—and thus the probes 3118. Such movement can, for example, compensate for thermally induced movement, contraction, expansion, bowing, etc. of any part of the probe card assembly 3101 or the DUT 120. For example, during testing of the DUT 120 at 4108, 2508 and 2510 of the process 2500 of FIG. 23 can be implemented.

At 4110 of FIG. 41, the probe head assembly 3102 can be changed. For example, the probe head assembly 3102 can be unplugged from pluggable connectors 3208 and mechanically detached from the actuators 3106. Another probe head assembly (e.g., that is in some ways generally similar to probe head assembly 3102) can then be plugged into pluggable connectors 3208 and mechanically attached to the actuators 3106 and used to test DUTs (not shown). (Probe head assemblies can be attached to and detached from the actuators 3106 as discussed above.) As mentioned above, 4110 of FIG. 41 can be accomplished while the mounting structure 3112 remains attached to the insert ring 110. Thereafter, 4104, 4106, and 4108 can be repeated to test other DUTs (e.g., similar to or different from DUT 102) using the new probe head assembly.

Figure 24:
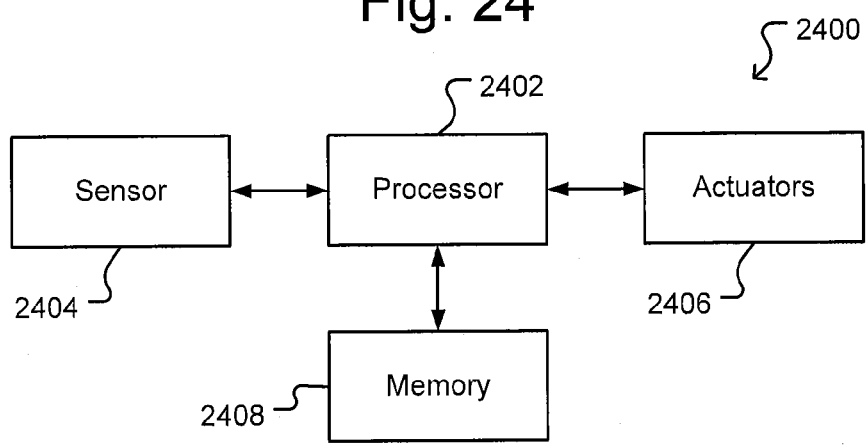
FIG. 24 illustrates an exemplary system for executing the process of FIG. 23.

Although specific embodiments and applications of the invention have been described in this specification, there is no intention that the invention be limited these exemplary embodiments and applications or to the manner in which the exemplary embodiments and applications operate or are described herein. For example, the locations of actuators (e.g., 702, 1312, 1406, 1704, 2050) and spring biasing mechanisms (e.g., 1402, 1902) may be changed from what is shown in the exemplary embodiments illustrated in the figures. As one example, actuators (e.g., 702, 1312, 1406, 1704, 2050) may be attached to any one or more of the following: any part of a probe card assembly (e.g., 406), an insert ring (e.g., 110), a bridge structure (e.g., 1802, 2000), a head plate (e.g., 112), other elements of a prober (e.g., 122) or housing (e.g., 422), or any part of a test head (e.g., 106). Biasing spring mechanisms (e.g., 1402, 1902) may also be attached to any part of a probe card assembly (e.g., 406), an insert ring (e.g., 110), a bridge structure (e.g., 1802, 2000), a head plate (e.g., 112), other elements of a prober (e.g., 122) or housing (e.g., 422), or any part of a test head (e.g., 106). Electronics and other elements for sensing a position of the probe card assembly (e.g., 406), probes (e.g., 414), DUT (e.g. 420) and for changing an orientation of probes (e.g., 414) and/or probe card assembly (e.g., 406) may be disposed in whole or in part on one or more of the any part of a probe card assembly (e.g., 406), an insert ring (e.g., 110), a bridge structure (e.g., 1802, 2000), a head plate (e.g., 112), other elements of a prober (e.g., 122) or housing (e.g., 422), or any part of a test head (e.g., 106). Another exemplary modification the orientation of DUT 420 can be adjusted by tilting or otherwise moving chuck 424. The chuck 424 thus can be used to planarize terminals 418 of DUT 420 to probes 414. Such use of chuck 424 can be in place or in addition to planarizing probes 414. Yet another exemplary modification is as follows: although memory 2156 and controller 2154 are shown in FIG. 24 and described above as communicating wirelessly, memory 2156 and controller 2154 can alternatively communicate through a direct wired link (not shown).

We claim:

1. A probe card assembly comprising:
    a probe head assembly comprising a plurality of probes disposed to contact an electronic device disposed on a holder in a test housing; and
    a wiring substrate comprising an electrical interface to a test controller and a plurality of electrical wiring that is part of electrical paths between the electrical interface and ones of the probes, the wiring substrate comprising a first portion forming a periphery of the wiring substrate and on which the electrical interface is disposed and a second portion disposed within the periphery formed by the first portion and being part of the probe head assembly, and the second portion is moveable with respect to the first portion,
    wherein the first portion is substantially rigid and the second portion is substantially rigid.

2. The probe card assembly of claim 1 further comprising:
    an attachment structure by which the probe card assembly can be attached to and detached from the test housing; and
    an adjustment mechanism configured to adjust an orientation of the probe head assembly including the second portion of the wiring substrate with respect to the attachment structure without changing an orientation of the first portion of the wiring substrate.

3. The probe card assembly of claim 2, wherein the first portion of the wiring substrate and the second portion of the wiring substrate are mechanically decoupled but electrically connected.

4. The probe card assembly of claim 3, wherein the first portion of the wiring substrate comprises a plurality of independent first sections of the wiring substrate, and the second portion of the wiring substrate comprises an independent second section of the wiring substrate disposed between the first sections.

5. The probe card assembly of claim 4 further comprising a pluggable flexible electrical connections between ones of the first sections and the second portion of the wiring substrate.

6. The probe card assembly of claim 3 further comprising flexible electrical connectors between the first portion of the wiring substrate and the second portion of the wiring substrate.

7. The probe card assembly of claim 1, wherein the wiring substrate comprises flexures disposed between the first portion and the second portion.

8. The apparatus of claim 7, wherein the flexures comprise machined portions of the wiring substrate, wherein the machined portions of the wiring substrate are less rigid than the first portion and the second portion of the wiring substrate.

9. The apparatus of claim 7, wherein the flexures comprise a double-hour glass shape cut into the wiring substrate.

10. The probe card assembly of claim 2, wherein the adjustment mechanism is configured to move the probe head assembly along an axis that is perpendicular to a surface of the electronic device disposed on the holder.

11. The probe card assembly of claim 2, wherein the adjustment mechanism is configured to tilt the probe head assembly with respect to a surface of the electronic device disposed on the holder.

12. The probe card assembly of claim 2, wherein the adjustment mechanism comprises a plurality of actuators each configured to move a portion of the probe head assembly.

13. The probe card assembly of claim 2, wherein the probe head assembly further comprises:
    a probe substrate to which ones of the probes are attached; and
    electrical connections between the second portion of the wiring substrate and the probe substrate.

14. The probe card assembly of claim 2, wherein:
    the probe head assembly is configured to be attached to and detached from the adjustment mechanism; and
    the second portion of the wiring substrate is configured to be electrically connected to and electrically disconnected from the first portion of the wiring substrate.

15. The probe card assembly of claim 2, wherein the attachment mechanism is the only mechanical mechanism by which the probe head assembly is attached to another portion of the probe card assembly.

16. The probe card assembly of claim 1, wherein the electrical wiring comprises electrically conductive traces and electrically conductive vias on or in the first portion of the wiring substrate and the second portion of the wiring substrate and flexible electrical connections between the first portion and the second portion of the wiring substrate.

17. A probe card assembly comprising:
    a probe head assembly comprising a plurality of probes disposed to contact an electronic device disposed on a holder in a test housing;
    an electrical interface to a test controller; and a wiring substrate comprising wiring that forms portions of electrical paths between the electrical interface and the probes, the wiring substrate comprising a first portion that forms a periphery of the wiring substrate and a second portion disposed within the periphery formed by the first portion, wherein the first portion is configured to remain substantially stationary and the second portion is configured to be moveable with respect to the first portion, wherein the electrical paths comprise flexible electrical connections between the first portion and the second portion of the wiring substrate.

18. The probe card assembly of claim 17 further comprising:

attachment means for attaching the probe card assembly to the test housing; and adjusting means for selectively adjusting an orientation of the probe head assembly with respect to the attachment means.

19. The probe card assembly of claim 18, wherein:

the second portion of the wiring substrate is part of the probe head assembly, and while the adjusting means adjusts the orientation of the probe head assembly, the first portion of the wiring substrate remains stationary with the attachment means, and the second portion of the wiring substrate moves with the probe head assembly.

20. The probe card assembly of claim 19, wherein:

the attachment means comprises feet disposed about a periphery of the attachment means and a bridge portion between the feet, and the probe head assembly is suspended from the bridge portion by the adjusting means.

* * * * *